United States Patent [19]
Peltzer et al.

[11] Patent Number: 4,836,861
[45] Date of Patent: Jun. 6, 1989

[54] SOLAR CELL AND CELL MOUNT

[75] Inventors: Douglas L. Peltzer, Cupertino; Richard L. Bechtel, Sunnyvale; Wen C. Ko, San Jose; William T. Liggett, Hollister, all of Calif.

[73] Assignee: Tactical Fabs, Inc., San Jose, Calif.

[21] Appl. No.: 174,635

[22] Filed: Apr. 11, 1988

Related U.S. Application Data

[63] Continuation-in-part of Ser. No. 42,409, Apr. 24, 1987, abandoned.

[51] Int. Cl.[4] ...................... H01L 31/06; H01L 31/18
[52] U.S. Cl. ..................................... 136/246; 136/244; 136/255; 136/256; 136/259; 437/2; 437/189; 437/209
[58] Field of Search ............... 136/244, 246, 255, 256, 136/259; 437/2, 189, 209

[56] References Cited

U.S. PATENT DOCUMENTS

| | | | |
|---|---|---|---|
| 3,890,636 | 6/1975 | Harada et al. | 357/68 |
| 4,024,568 | 5/1977 | Yoshimura | 357/68 |
| 4,148,047 | 4/1979 | Hendrickson | 357/23 |
| 4,234,352 | 11/1980 | Swanson | 136/253 |
| 4,427,457 | 1/1984 | Carlson et al. | 437/20 |

OTHER PUBLICATIONS

R. M. Swanson, *Solar Cells*, vol. 17, pp. 85–118 (1986).
R. A. Sinton, *Conf. Record, 18th IEEE Photovoltaic Specialists Conf.* (1985), pp. 61–65.
G. T. Crotty, *Conf. Record, 18th IEEE Photovoltaic Specialists Conf.* (1985), pp. 424–429.
R. M. Swanson, *Conf. Record, 18th IEEE Photovoltaic Specialists Conf.* (1985), pp. 604–610.
R. A. Sinton et al., *IEEE Electron Device Letters*, vol. EDL-7, Oct. 1986, pp. 567–569.
R. W. Taylor et al., EPRI Project Report CP4752, Research Project 1415-7, Aug. 1986, pp. S9, S10, 2-24, 2-28, 2-30, 3-3, 3-4,3-9.
R. A. Sinton, Dissertation, Stamford Univ. (1987), pp. iii–60.

Primary Examiner—Aaron Weisstuch
Attorney, Agent, or Firm—Skjerven, Morrill, MacPherson, Franklin & Friel

[57] ABSTRACT

A point contact solar cell structure and method of manufacturing which provides metal contact from positive and negative bus bars to alternating n-wells and p-wells in a solar cell crystal. The solar cell spans two side-by-side metal bus bars. On the bottom surface of the cell crystal two side-by-side perforated metal layers contact wells of only one conductivity type. Holes in the perforated metal layers are located beneath wells of the opposite conductivity type. An insulated junction between the two perforated metal layers is located directly above the junction between the two side-by-side metal bus bars. Fingers from the perforated metal layer above one bus bar reach across and down to contact the opposite bus bar. Metal lines also reach from the bus bars up through the holes in the perforated contact layers and contact wells within the crystal. This way, all n-wells and p-wells have electrical contact to their respective bus bars. A preferred embodiment includes a passivation layer applied to top and sides of the solar cell after dicing thus providing an anti-reflection coating on the top surface and means for reducing recombination of electrons and holes at edges of the solar crystal back to the interior of the crystal for capture by a p-well or n-well. Benefits include increased cell efficiency, reduced number of masking steps in the manufacturing process as compared to other point contact structures, and improved thermal conductivity through the cell, resulting in lower manufacturing cost and longer cell life.

55 Claims, 11 Drawing Sheets

SOLAR CELL AND CELL MOUNT

This is a continuation-in-part of Patent Application Ser. No. 07/042,409 filed Apr. 24, 1987, now abandoned.

FIELD OF THE INVENTION

This invention relates to the manufacture of solar cells, and more particularly to a solar cell and a mounting structure for a solar cell which allows a greater portion of the cell surface to be used for generating power than heretofore and which provides a simpler and less expensive mounting structure.

BACKGROUND OF THE INVENTION

At a time when consumable energy sources are being depleted and becoming more expensive, there is increased motivation to inexpensively harness solar energy.

One type of solar generating plant comprises an array of posts located in a field and holding panels of solar devices. Typically, these panels track the sun across the sky, maintaining an angle which presents maximum solar radiation to the devices. Optical means for concentrating solar power onto a small solar cell are generally included thus providing more power for a given solar cell area.

One concentrator which has proven practical in protecting delicate solar cells as well as concentrating large amounts of solar power onto the surfaces of the cells is shown in FIG. 1. Post 11 is rigidly attached to the ground and extends vertically upward. At the top of post 11 is attached long bar 12, held by motorized gear box 15 which is controlled to track the sun across the sky. Attached to long bar 12 are cross bars 13a–13h. To each of cross bars 13a–13h are attached two tubs 14a–14h and 14a'–14h' at opposite sides of the mid-point where the cross bars 13a–13h are attached to the long bar 12. For clarity only tubs 14h and 14h' are shown. Each tub has within it an array of focusing devices, each of which focuses sunlight onto a solar cell located at the bottom of the tub.

FIG. 2 shows tub 14a in a more normal detail. Located on the top surface of tub 14a is an array of Fresnel lenses 21a–21j. The focal points of these lenses are at approximately the bottom surface of tub 14a. Located in the vicinity of each focal point is an associated solar cell 24a–24j. Solar cells 24b, 24c, 24g, and 24h are shown in FIG. 2 but only solar cell 24g is numbered in FIG. 2. Each of the solar cells 24a–24j is supported by a metal and ceramic heat sink 23a–23j (only heat sinks 23g and 23h are numbered in FIG. 2) which is attached to the bottom of tub 14a. Attached to solar cells 24a–24j are secondary optical elements 22a–22j (only elements 22b, 22c and 22g are numbered in FIG. 2) each having four walls which reflect solar radiation onto cells 24a–24j respectively, thus further concentrating the solar energy transmitted through Fresnel lenses 21a–21j onto solar cells 24a–24j and making orientation of the array with respect to the sun less critical than would be the case without these walls.

Early solar cells had an efficiency of converting solar radiation energy into electricity of less than 10%, and were not economically feasible as a major power source.

A more efficient design, called a point contact solar cell, is described in Swanson, U.S. Pat. No. 4,234,352, especially with respect to Swanson FIGS. 5–10. This Swanson patent is incorporated herein by reference. The point contact cell is further described by Ronald A. Sinton in his doctoral dissertation entitled "Device Physics and Characterization of Silicon Point-Contact Solar Cells", Stanford University, 1987, particularly at pages 18–22, also incorporated herein by reference. The point-contact cell provides an array of point contacts for collecting electrons and holes which have been separated by impinging photons from the sun. As further discussed by R. A. Sinton, Young Kwark, J. Y. Gan and Richard M. Swanson in an article "27.5-Percent Silicon Concentrator Solar Cells", IEEE Electron Device Letters, Vol. EDL-7, No. 10, Oct. 1986, also incorporated herein by reference, this device achieves an efficiency approaching 28%, more than twice that of previous silicon solar cell structures.

FIG. 3a shows an exploded view of a prior art-point contact solar cell. A piece of semiconductive silicon crystal 31 has formed within it and contacting its bottom surface, wells of p-type and n-type impurities such as wells $31p1$, $31n1$, $31p2$, and $31n2$, where the letter "p" or "n" at the end of each number 31 represents the conductivity type of the designated well. The pattern of conductivity types of the impurity wells such as wells $31p1$, $31n1$, $31p2$, and $31n2$ alternates throughout the bottom surface of semiconductor crystal 31. These impurity wells collect the charged particles generated by solar photons. In order to produce a current, an electrical path to outside circuitry must be provided.

One electrical path configuration, not shown, is to provide interleaved metal fingers arranged so that wells of one conductivity type contact one set of fingers and wells of the other conductivity type contact the other set of fingers. These sets of fingers are then connected to bus bars which carry the current away from the cell. Such an arrangement suffers a loss of efficiency due to the ohmic resistance of the long thin fingers.

Another electrical path geometry, shown in exploded view in FIG. 3a and in cross-section in FIG. 3b, overcomes the ohmic loss inherent in the long thin fingers by having thin fingers of short length. FIG. 3b shows a cross section taken along the lines B—B of FIG. 3a.

The structure of FIGS. 3a and 3b is formed as an integrated circuit having a 2-layer metal interconnect structure. As shown in FIGS. 3a and 3b, the cell is oriented so that the metal layers are on the bottom, rather than the top of the structure. Crystal 31 is the semiconductor substrate, passivation layer 35 is oxide (typically an oxide of silicon) adjacent the substrate, metal layer 32 is the first metal interconnect of an integrated circuit structure, glass layer 33 is a passivation layer between first and second metal, and metal layer 34 is the second metal interconnect of an integrated circuit structure.

Beneath and adjacent crystal 31 is passivation layer 35 patterned to have openings such as $35o1$ to expose the p and n wells such as wells $31n1$, $31p1$, $31n2$, and $31p2$. Contacting passivation layer 35 is n-contact metal layer 32, having openings such as $31o2$, surrounding small conductive p-well pads such as $32p1$, $32p2$. The openings such as openings $32o1$, $32o2$ in metal layer 32 are positioned so that when conductive protrusions or "fingers" such as protrusions $32n1$ and $32n2$ of n-contact metal layer 32 are in electrical contact with semiconductor crystal 31 through openings such as $35o1$ and $35o3$ (but not $35o2$), respectively, in insulation layer 35, the p-wells in crystal 31 are not contacted by any part of n-contact layer 32. Rather, only the n-wells such as 31n1 and 31n2 in crystal 31 are contacted by the layer 32. The p-wells such as wells 31p1, 31p2 of semiconductor crystal 31 are contacted only by the small conductive pads such as pads 32p1, 32p2 formed in the center of openings 32o1 and 32o2, respectively.

Insulating glass layer 33 contacts the bottom surface of n-contact metal layer 32 and has insulating protrusions such as 33r1 and 33r2 which extend through openings such as 32o1, 32o2 of n-contact metal layer 32. Protrusions such as 33r1 and 33r2 surround the small conductive pads such as 32p1 and 32p2. Protrusions such as 33r1 and 33r2 contact passivation layer 35, thus providing electrical insulation between n-contact conductive layer 32 and the p-wells such as 31p1, 31p2 of semiconductor crystal 31. Vias such as 33o1, 33o2 are formed through the centers of protrusions such as 33r1 and 33r2, respectively, from insulation 33. The p-contact conductive pads such as 32p1, 32p2 are partly located in vias 33o1 and 33o2 and extend to and contact p-wells 31p1 and 31p2. P-contact metal layer 34 is located beneath insulating glass layer 33 and includes short protrusions or "fingers" such as 34p1, 34p2 which extend part way through vias such as 33o1, 33o2 in insulating layer 33 and contact the small conductive pads such as 32p1, 32p2, which in turn contact the p-wells such as 31p1, 31p2 in semiconductor crystal 31. Thus metal layers 32 and 34 gather the opposite charges generated in semiconductor crystal 31 by solar radiation incident on crystal 31.

FIG. 4a shows a geometry for packaging the cell of FIGS. 3a and 3b and bringing out metal leads to connect metal layers 32 and 34 of FIGS. 3a and 3b to outside wiring. As shown in FIG. 4a, cell 24g has p-wells and n-wells (such as wells 31n1, 31p1 shown in FIGS. 3a and 3b) embedded into only its center portion 31a. Secondary optical element 22g is attached to the solar cell at the outer edges of active region 31a so that all sunlight is focused onto active area 31a. P-contact metal layer 34 is positioned beneath this active area 31a. In contact with metal layer 34 is portion 44b of p-contact bus 44 which includes a side extension 44a leading to outside wiring (not shown). N-contact metal layer 32 extends to the perimeter of cell 24g and region 32e (also shown in FIGS. 3a and 3b) extends downward near the perimeter of cell 24g into the plane of p-contact layer 34. N-contact layer 32 is separated at all points from p-contact layer 34 by insulating glass layer 33, shown in FIGS. 3a and 3b and discussed above. Contacting the downward extending perimeter 32e of n-contact layer 32 is portion 42b (FIG. 4a) of n-contact bus bar 42 leading to outside wiring. Copper (or other metal) heat spreader 23g (also shown in FIG. 2) attaches to back plane heat sink 16a at the bottom of tub 14a.

With the packaging of FIG. 4a, not all of solar cell 24g can be used for actively collecting energy. This is because a perimeter including n-contact extension 32e must be provided to connect to bus bar 42b. Since n-contact region 34 does not extend to the perimeter, no electricity can be generated in this perimeter area.

Cell 24g of FIG. 4a, in addition to not making use of the full surface area of semiconductor crystal 31, also requires attaching secondary optical element 22g directly to crystal 31 in order to maintain the high conversion efficiency of 28%. Delicate semiconductor crystal 31 is not well adapted to reliably support such a structure.

According to an interim report entitled "High-Concentration Photovoltaic Module Design" by Black & Veatch, Engineers-Architects, prepared for Electric Power Research Institute, Aug. 1986, and available from Research Reports Center, Box 50490, Palo Alto, CA 94303 as Report No. AP-4752, as discussed on pages s-9 to s-10, test cells similar to cell 24g shown in FIG. 4a, in which bus bars similar to bus bars 42 and 44 were formed of a sandwich having an insulating alumina core with direct bonded copper on both top and bottom surfaces, and which had heat spreaders of nickel plated aluminum, were cycled in temperature from $-30°$ C. to $+150°$ C. at one cycle per 80 minutes, and all samples failed between 200 and 350 cycles due to separation of the solder bond between the copper metallized alumina layer (42b and 44b in FIG. 4a) and a nickel plated aluminum heat spreader (23g). Failure was attributed to voids associated with solder dewetting of a gold-covered nickel plating on the substrate lower copper foil.

An alternative approach that eliminates insulation above the central portion of the heat spreader is shown in FIG. 4b. As shown in FIG. 4b, bus 44 in FIG. 4a is eliminated and insulator 45 has a hole in its center, thereby insulating only bus 42 from heat spreader 23g. Bus 44 is replaced by a solder plug 46, which extends between a central portion of heat spreader 23g and p-contact metal 34 at the bottom surface of cell 24 g. Heat spreader 23g also serves as the contact between a positive conductor and the cell. A cell of this type is described by Black & Veatch on p. s-10 of the above cited paper and shown in FIG. 4c. Components in FIG. 4c equivalent to components in FIG. 4b have the same numbers. As stated by Black & Veatch, the structure of FIG. 4c reduces thermal resistance, allowing the cell to operate at a cooler temperature, and also eliminates the solder bond between substrate and heat spreader which caused the earlier failure. However, a relatively large mismatch in coefficients of thermal expansion exists between the silicon solar cell and the copper heat spreader.

The cell of FIG. 4b still suffers from the nonuse of the peripheral portion of 32e of the solar cell where the n-contact layer 32 extends down to contact bus bar 42. The cell of FIG. 4b also retains the structural weakness from attaching secondary optical element 22g directly to the top surface of delicate solar cell 24g at the rim of the active area.

SUMMARY OF THE INVENTION

The solar cell and mount geometry of this invention achieve an efficiency of energy conversion as high as the point-contact cell described above and additionally use more than 90% of the solar cell surface. The mount geometry of this invention provides good heat dissipation beneath the solar cell, thus allowing the cell array to run cooler. Because the connecting structure allows nearly the full surface of the solar cell semiconductive layer to be used as active area, a secondary optical element can be attached, not to the delicate cell itself, but to the more rugged surrounding support, thus improving the ruggedness of the resulting structure. The solar cell and mounting structure of this invention are manufactured at a lower cost but achieve higher reliability in the field than the prior art cells.

In accordance with this invention, a point contact structure is provided for electrically connecting the checkerboard-like pattern of n-wells and p-wells of the solar cell semiconductive layer to bus bars which lead to outside wiring. The electrically conductive components of the structure are arranged in three layers, the semiconductive layer on top, in the next layer a pair of perforated conductive well contact regions, each region contacting approximately half of the crystal, and, at the bottom, a pair of bus bars beneath the perforated conductive well contacts. In addition two insulating layers sandwiched between the conductive layers provide appropriate electrical isolation, a first layer of insulation between the semiconductive layer and the first conductive layer and a second layer of insulation between the first conductive layer and the bus bars. In the first layer of insulation are formed openings to expose the surfaces of the p-wells and the n-wells in the semiconductor layer.

In the process of forming the structure of this invention, the two conductive well contact regions are formed from the same layer of metal formed over the first layer of insulation. This first layer of metal extends through the openings in the insulation to contact the surfaces of all the n-wells and p-wells. This first metal layer is then masked and etched so as to remove all metal along a crenellated dividing line running down the middle of the metal layer so as to form the metal layer into two electrically separated conductive contact regions (a first conductive contact region and a second conductive contact region). In addition, the same masking step removes annular portions of the metal in the first conductive contact region above all the wells of one conductivity type (a first conductivity type) directly adjacent the first conductive contact region and removes annular portions of the metal in the second conductive contact region above all the wells of the other conductivity type ( a second conductivity type opposite to the first conductivity type) thereby to form conductive pads to the wells of the first conductivity type directly next to the first conductive contact region and to form conductive pads to the wells of the second conductivity type directly next to the second conductive contact region.

Thus the same etching step which forms the crenellated diagonal between the first contact region and the second contact region also removes the metal in annular rings adjacent all wells of the first conductivity type in the portion of the cell contacted by the first conductive contact region and removes the metal in annular rings adjacent all wells of the second conductivity type in the portion of the cell contacted by the second conductive contact region.

The result is to leave conductive pads of metal over approximately the center of each of the wells of the first cnductivity type associated with the first conductive contact region and to leave conductive pads of metal over each of the wells of the second conductivity type associated with the second conductive contact region.

Each of the wells contacted by a conductive pad is isolated from the conductive contact region directly surrounding it.

The line dividing the first conductive contact region from the second conductive contact region is crenellated such that fingers protrude from both the first conductive contact region and the second conductive contact region in an interdigitated fashion. Thus the fingers protruding from the first conductive contact region extend toward the second conductive contact region between fingers of conductive material extending in the opposite direction from the second conductive contact region. The result is a series of interdigitated fingers of conductive material extending from one conductive contact region into but electrically insulated from the other conductive contact region.

A second insulating layer is formed over the first conductive contact region and the second conductive contact region. Openings are formed in the second insulating layer to expose a portion of that end of each of the interdigitated fingers furthest from the conductive contact region to which that finger is connected, and to expose each of the conductive pads.

Two electrically conductive bus bars are then formed directly in contact with this second layer of insulation. Conductive protrusions extend from each bus bar up through the second layer of insulation to the conductive pads surrounded by but insulated from the corresponding conductive contact region directly above the bus bar. In addition, conductive protrusions extend from each bus bar to the interdigitated fingers extending from the other conductive contact region not directly above the bus bar.

To form electrical contact, therefore, to all of the wells of one conductivity type, electrically conductive material extends from one of the bus bars up through openings in the second insulating layer to the conductive pads contacting the wells of one conductivity type in the half of the semiconductor layer above that bus bar, and to the interdigitated fingers extending from the conductive contact region which contacts directly the wells of this one conductivity type in the other half of the semiconductor layer not above that bus bar.

The conductive protrusions from each bus bar are electrically insulated from the conductive contact region directly above the bus bar by the second layer of insulation. The interdigitated fingers extending from the conductive contact region which is in eletrical contact to wells of the opposite conductivity type on the opposite half of the cell also connect electrically to this bus bar and are electrically insulated by the second layer of insulation from the other bus bar.

Thus, contrary to the prior art, each of the p-wells is contacted by a conductive contact region or by a p-type bus bar. The p-type conductive contact region is located directly above n-bus and the n-type conductive contact region is located directly above the p-bus. Each bus is located under one half of the solar cell, thereby insuring that both busses and the two conductive contact regions are at substantially the same temperature. Also, the entire surface of the semiconductor crystal is at a substantially uniform temperature. The result is a symmetry in structure which reduces temperature gradients across the device and the impact of thermal cycling on the device.

Since the perforated conductive layers, usually metal, are located side by side, a reduction in resistance losses within the solar cell can be achieved. The short conductive paths from the wells within the solar crystal to the p-bus and n-bus bars, the thickness of a solder layer used for attaching the solar cell die to the supporting bus bar and heat spreader structure, and the thickness of the bus bars themselves all reduce electrical resistance compared to the prior art. This lowering of resistance improves cell efficiency.

Additionally, since the perforated conductive well contacts are side-by-side in the same layer, they can be formed simultaneously during the manufacturing process, saving manufacturing steps and reducing the risk of defects. Forming the conductive contacts in a single layer of metallization also saves two masking operations.

An electrically insulating layer is located between the semiconductive layer and the perforated well contacts, another insulating layer is located between the perforated well contacts and the bus bars (as stated above), and in one embodiment a thin electrically insulating layer is located between the large bus bars and a metal heat spreader beneath the bus bars. This electrical insulation also produces thermal insulation. However, because the bus bars can be large, the thin electrical insulating layer above the heat spreader does not significantly impede thermal conductivity to the heat spreader. Attaching the large bus bars to the heat spreader beneath the insulation layer also provides good mechanical stability for the structure. The large bus bars themselves are also useful for spreading a portion of the heat in a lateral direction.

The spacing between the bus bars and any other spaces beneath the cell will not have the same high thermal conductivity as the regions in contact with the bus bars, so in these spacing regions the solar cell will be hotter. These spacing regions must be controlled and are preferably minimized in size.

Because the thermal conductivity is improved, a larger cell will operate at the same temperature as a smaller cell of the prior art design shown in FIGS. 3a, 3b, 4a, 4b, and 4c. Estimates are that a cell 1 cm on a side fabricated according to this invention will operate at about the same temperature as a cell 0.8 cm on a side made as shown in FIG. 3a. And since the entire area of the solar cell according to the current invention receives solar radiation, there will not be such a sharp temperature gradient across the surface of the solar cell as in the prior art solar cell. In a prior art cell such as that shown in FIG. 3a, the concentrated solar energy directed to the active area in the center of the cell produces a high temperature region. The edge of the cell in FIG. 3a does not receive solar radiation. This produces a temperature gradient across the surface from the center to the edge of the cell, varying with illumination and resulting in fatigue of the die-attaching solder and a shorter cell life.

In order to maintain high efficiency of the solar cell near its edge, where charge carriers can recombine or escape from the edge, a passivation layer is applied to the edge. This passivation layer has the effect of retaining the charge carriers which would otherwise leak away from the center of the cell where they can be collected by the point contact regions.

This edge passivation material is also preferably applied to the top surface of the semiconductive layer in order to make the top surface less reflective and thus to capture more of the solar radiation. This passivation layer is formed after the insulating and conductive layers have been applied to the bottom of the semiconductive wafer and after a wafer including a plurality of solar cell dice has been separated into dice, thereby exposing the edges of the dice. Edge passivation after dicing also improves efficiency of solar cells of other designs than point contact.

Whereas in the prior art structure of FIG. 3a, 4a and 4b, secondary optical element 22g had to be attached to the edge of the active area of the semiconductive layer itself in order to direct all sunlight to the active area, in the current invention the entire surface of the cell is active, and thus in the current invention the secondary optical element is attached to other than the semiconductive layer, for example to the sturdier bus bars or the heat spreader beneath the bus bars.

Additionally, the positioning of the solar cell on the metal bus bars during manufacture is not critical in the lengthwise direction of the bus bars. During attachment, in order to get good contact, the bottom of the solar cell may be scrubbed against the metal bus bars on which is a layer of solder, and then heated to achieve good contact without the use of acid, thus further improving the life of the cell.

The simpler manufacturing process in accordance with this invention results in fewer manufacturing defects and metal-to-metal shorts, thus improving yield.

The above description refers to a single solar cell. The same principles can be applied to multiple cells mounted adjacent to one another in an array, each cell contacting both positive and negative bus bars. An array of solar cells may be preferred in such applications as outer space where a concentrating mechanism is not used and where the active surface area must be large. An array may also be preferred in an application using a concentrator where it is desirable to reduce the number of cell mounts.

An array of adjacent cells may be more cost-effective where a more sophisticated cooling system is available. A more sophisticated cooling system such as a forced air or forced liquid coolant system, or a vaporizing heat pipe can remove more heat from a given area than can a passive heat sink or heat spreader. Thus with active cooling, multiple solar cells can be located adjacent to each other even in a concentrator system without causing local overheating of the components. Reduced cost in a structure having multiple adjacent cells results from reducing the number of mounting structures that must be provided.

Similarly, when a concentrator system is not being used, or when a concentrator system is being used with a more sophisticated cooling system, the structure of this invention allows for a larger single cell having an area many times the area of the solar cell in FIG. 3a. Such a single cell feeds multiple adjacent fingers of positive and negative bus bars. In order that the distance that current flows through the perforated well contacts before reaching a thicker bus bar be minimized, the fingers used with a larger cell are not made larger than the fingers used with a smaller cell, rather there are more adjacent fingers. As with multiple adjacent cells described above, a large single cell allows for reduced cost from reducing the number of mounting structures.

Both the large cell and the array of adjacent cells also benefit from reduced sensitivity to the direction the array is pointing with respect to the location of the sun. A pointing error that moves the focal point a distance of one cm is unacceptable in a cell having a total width of one cm. However a pointing error that moves the focal point a distance of one cm may be quite acceptable in a cell or an array of adjacent cells having a total width of 5 cm or more. Thus in a large cell or an array of adjacent cells, high efficiency of energy conversion is maintained with a less precise pointing control.

BRIEF DESCRIPTION OF THE DRAWINGS

FIG. 3b shows a non-exploded cross-sectional view of the prior art solar cell of FIG. 3a.

FIG. 5b shows a non-exploded cross-sectional view of the solar cell and mount of FIG. 5a.

DETAILED DESCRIPTION

Figure 3A:
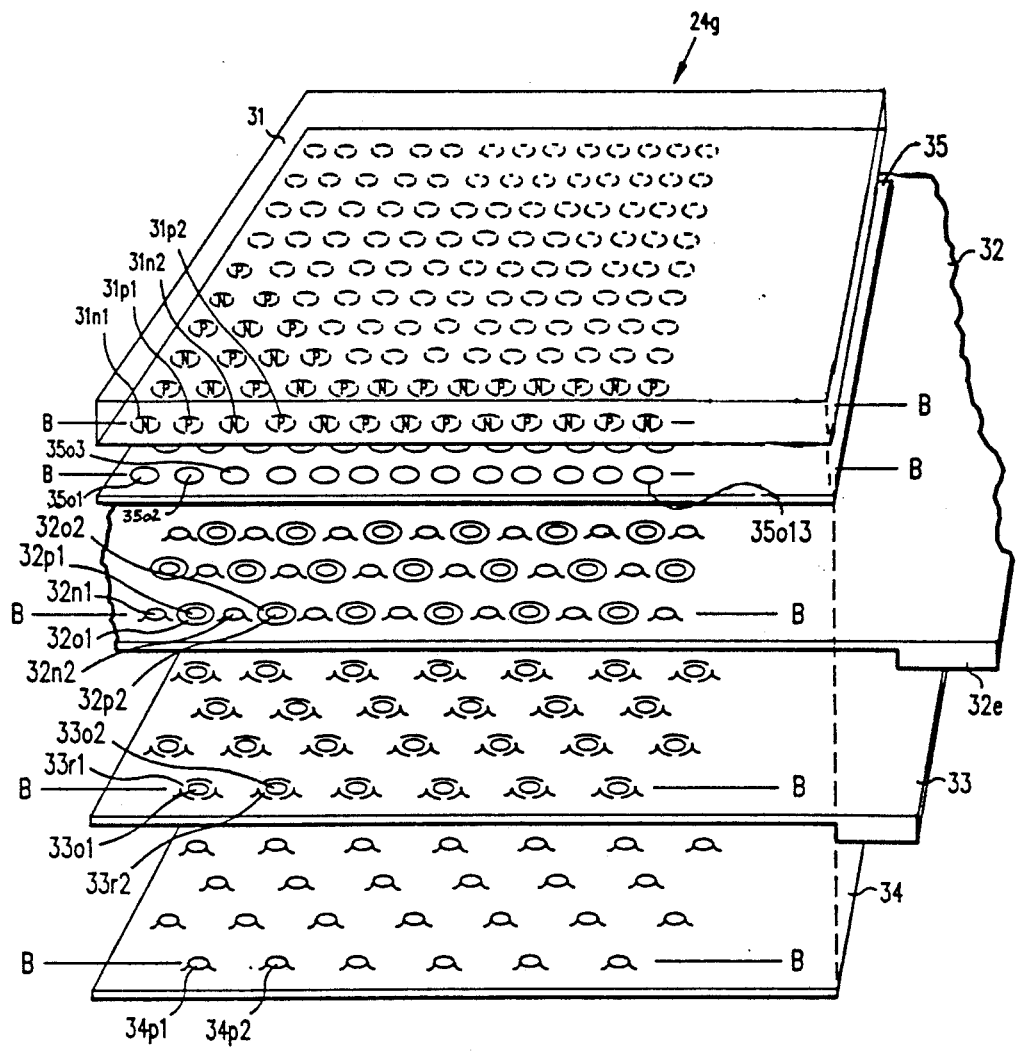
FIG. 3a shows a prior art solar cell, exploded view.
Figure 3B:
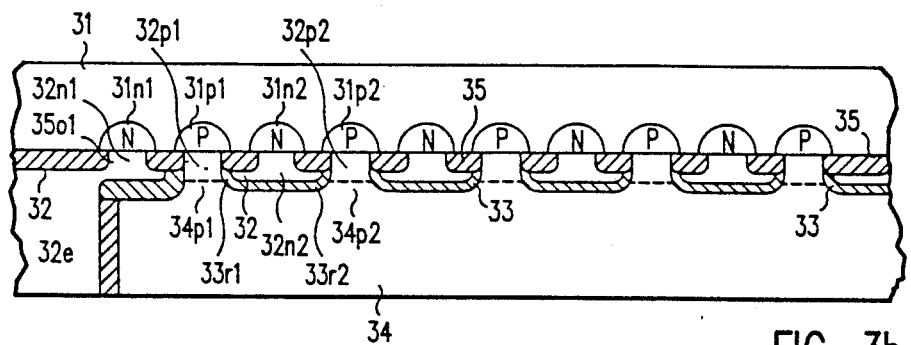
Figure 4C:
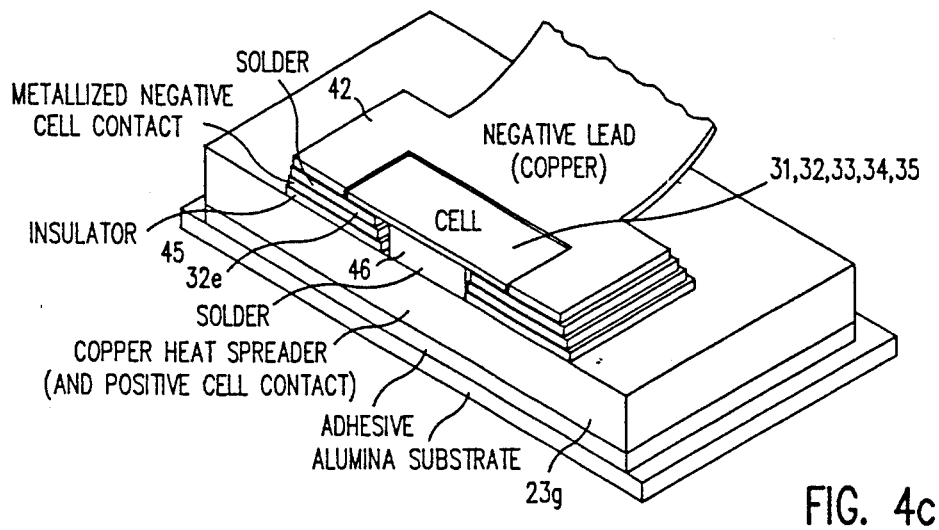
FIG. 4c shows a prior art solar cell similar to that of FIG. 4b.
Figure 5B:
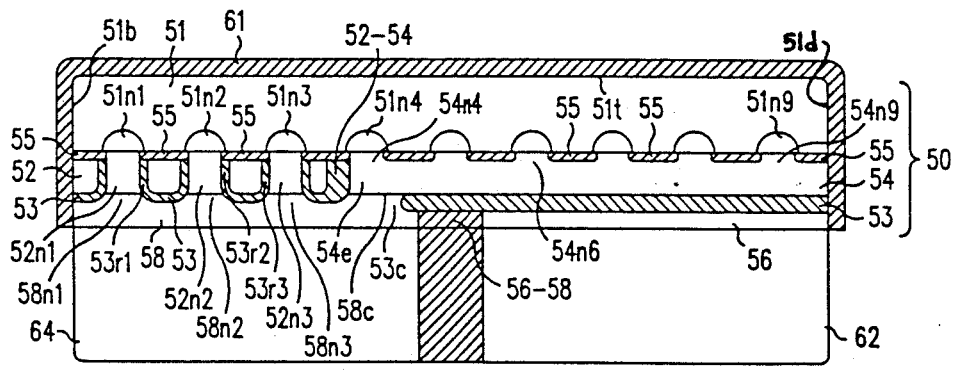
Figure 4A:
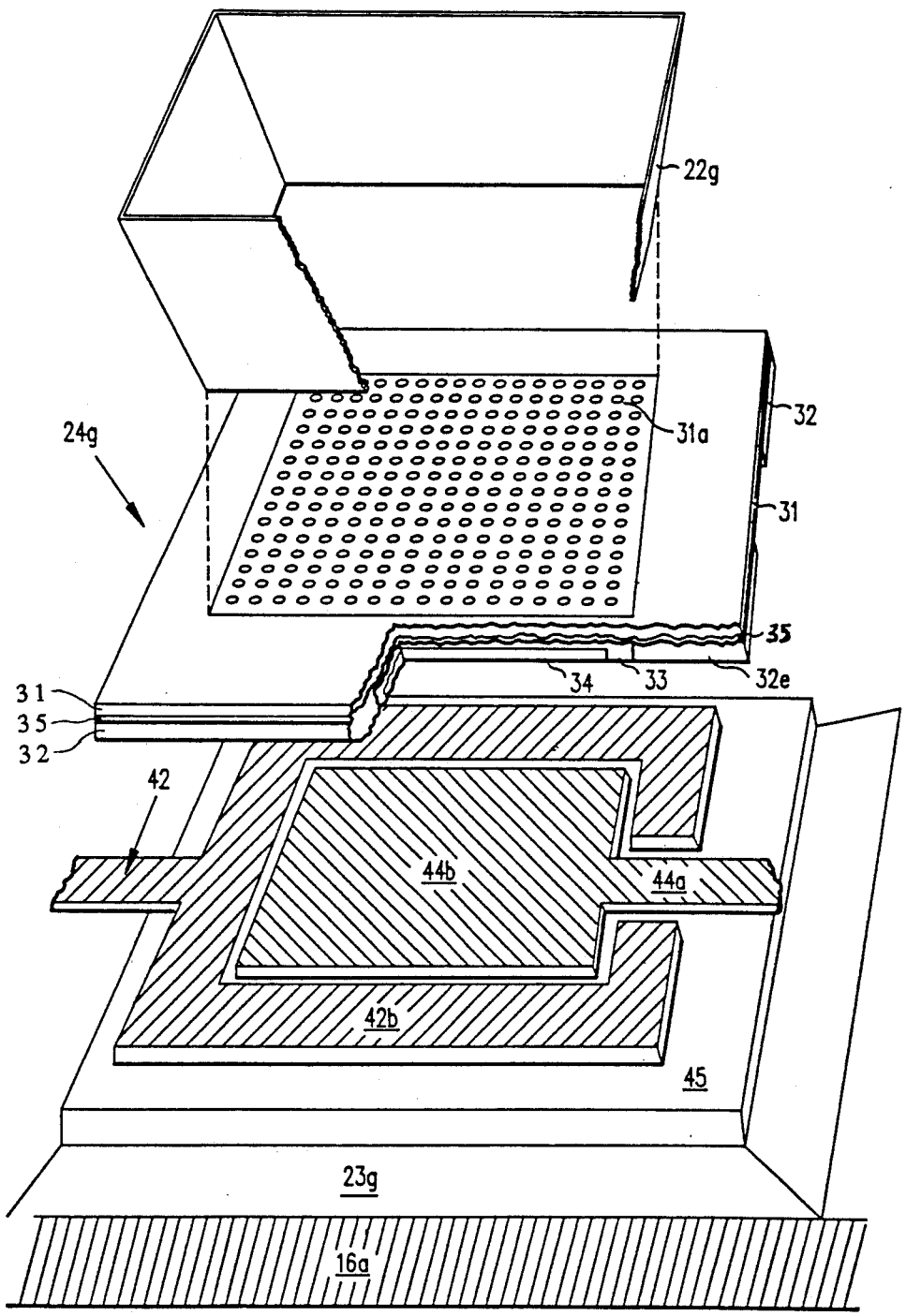
FIGS. 4a and 4b show two embodiments of a prior art solar cell mount, exploded view.
Figure 4B:
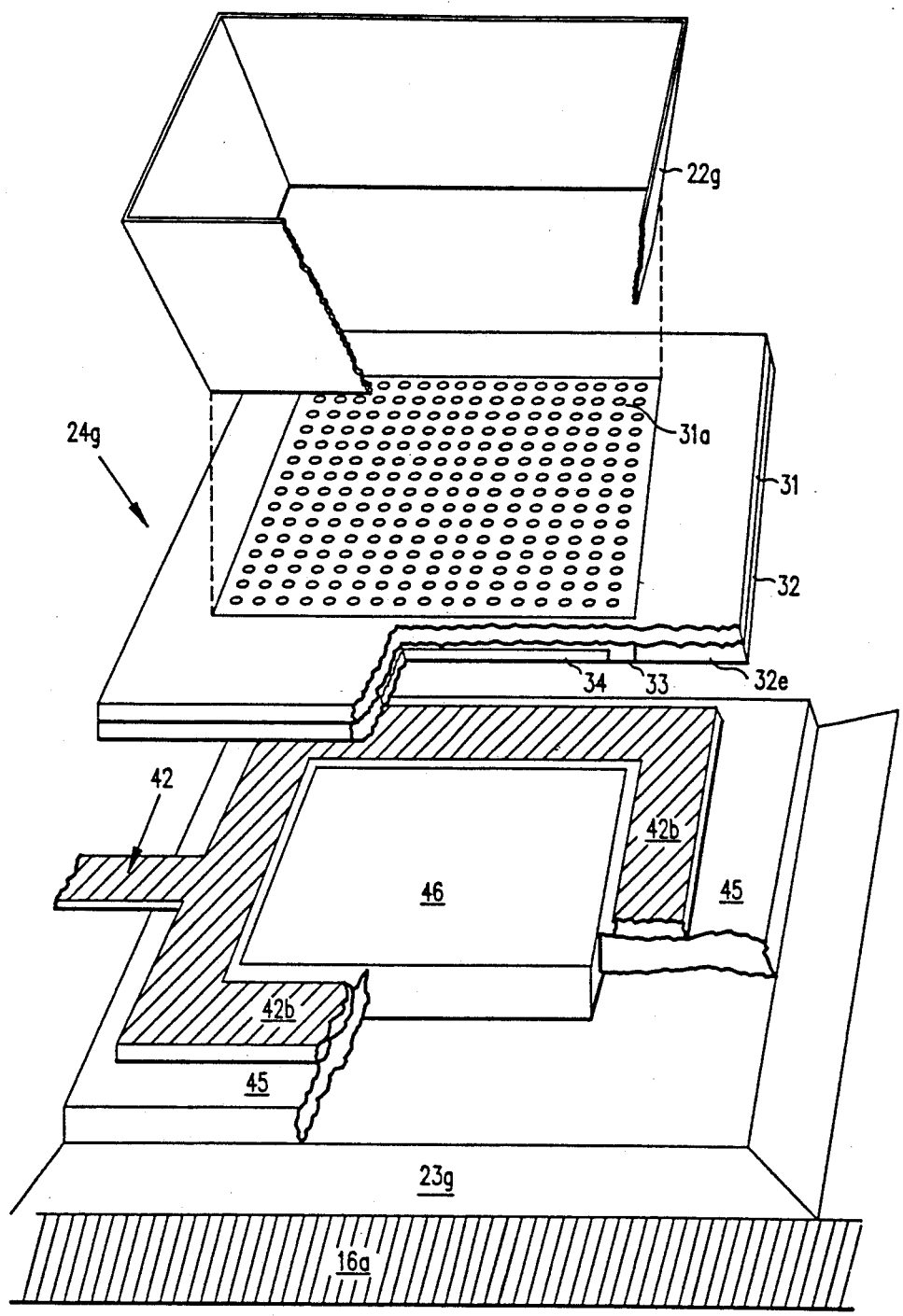
Figure 5A:
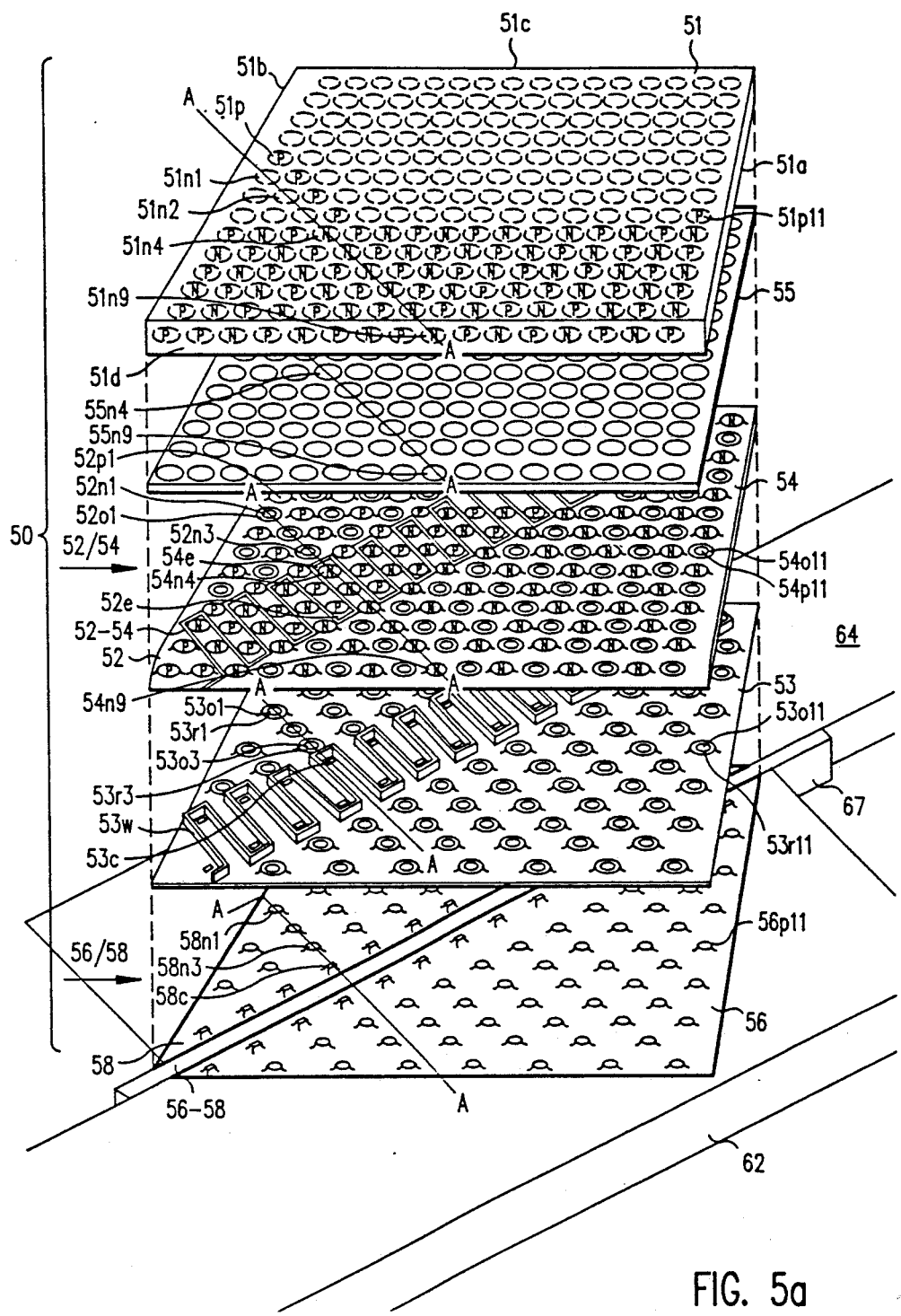
FIG. 5a shows in exploded view a solar cell and mount of the current invention.

FIG. 5a is an exploded view showing one embodiment of the invention. FIG. 5b is a non-exploded cross-sectional view of FIG. 5a, taken through along the diagonal lines A—A of Fig. 5a. The same numbers represent the same elements in both figures. Semiconductive layer 51, preferably of monocrystalline silicon, like prior art silicon crystal 31 of FIG. 3a, has formed within its body adjacent to its bottom surface an array of alternating p-wells and n-wells such as p-well 51p1 and n-wells 51n1 through 51n9. As in the prior art structure, these wells serve as collectors for the holes and electrons generated by solar radiation. However, unlike the prior art cell of FIG. 3a, the array of wells used with the current invention extends close to the edges such as edges 51a and 51b of cell 50. The term "cell" as used here refers to the semiconductive, conductive, and insulation layers such as layers 51, 55, 52/54, 53, and 56/58 of FIG. 5a, but does not include bus bars 62 and 64. In one embodiment the distance between edge 51b and wells such as 51n1 and 51p1 is 30 mils. Formed on the bottom surface of crystal 51 is insulation layer 55. As in the prior art cell of FIGS. 3a and 3b, insulation layer 55 is patterned to have vias such as 55n4 through 55n9 aligned with wells such as 51n4 through 51n9 in crystal 51. Applied to insulation layer 55 is a first conductive layer 52/54. First conductive layer 52/54 is patterned to form p-well contact region 52 and n-well contact region 54, separated electrically from each other along crenellated line 52-54 such that each of regions 52 and 54 is adjacent approximately half of insulation layer 55.

As can be seen in FIG. 5a, p-well contact conductive region 52 is perforated with openings such as 52o1. Within each opening of p-well conductive contact region 52 such as opening 52o1 there is a corresponding conductive n-well contact pad such as pad 52n1 contacting a corresponding n-well such as n-well 51n1. P-well contact region 52 contacts all p-wells such as p-well 51p1 in its half of layer 52/54 through short conductive extensions such as extension 52p1 which extends up through a corresponding opening in insulation layer 55 to contact a corresponding p-well 51p1.

Likewise, as can be seen in FIG. 5a, n-well conductive contact region 54 is perforated with openings such as opening 54o11 surrounding conductive contact pads such as pad 54p11. Each conductive contact pad such as pad 54p1 contacts a corresponding p-well such as p-well 51p11. And n-well conductive contact region 54 includes short extensions such as extensions 54n4 through 54n9 which extend through corresponding openings in insulation layer 55 to contact corresponding n-wells such as n-wells 51n4 through 51n9 in crystal 51.

In cross-sectional FIG. 5b, region 52 appears to be a series of separated portions, but is actually a single continuous region connected outside the plane of FIG. 5b, as can be seen in FIG. 5a. In FIG. 5b, region 54 appears as a continuous region but inlcludes perforations for p-wells which are outside the plane of the cross section, as can be seen in FIG. 5a.

Adjacent patterned first conductive layer 52/54 is insulation layer 53, preferably glass. As can be seen in both FIGS. 5a and 5b, insulation layer 53 extends with raised annular rings such as 53r1 and 53r3 through openings such as 52o1 through 52o3 in p-well contact region 52, and extends with raided annular rings such as 53r11 through openings such as 54o11 to contact insulation layer 55, thus isolating the contact pads such as pad 52n1 from region 52 by which they are surrounded, and isolating contact pads such as pad 54p11 from region 54 by which it is surrounded. Insulation layer 53 also extends upward between p-well contact region 52 and n-well contact region 54 to form crenellated wall 52-54, thus electrically isolating region 52 from region 54. Insulation layer 53 is patterned to form vias such as 53o1 through 53o3 in the centers of corresponding raised annular rings such as 53r1 through 53r3, thereby exposing all contact pads such as n-well contact pads 52n1 through 52n3 and p-well contact pad 54p11. Insulation layer 53 is also patterned to form cross-connection vias such as via 53c exposing finger tips adjacent crenellated wall 52-54, for example tip 54e in region 54 of layer 52/54.

A second conductive layer 56/58, preferably metal, applied to insulation layer 53 also contacts exposed first conductive layer contact pads such as n-well contact pads 52n1 through 52n3 and p-well contact pad 54p11 in layer 52/54. Extensions such as extension 58n1 through 58n3 in layer 56/58 extend through openings such as 53o1 through 53o3 in layer 53 to contact n-well contact pads such as pads 52n1 through 52n3 in region 52 of conductive layer 52/54. Likewise in layer 56/58, extensions such as 56p11 extend through openings such as 53o11 in layer 53 to contact p-well contact pads such as 54p11 in region 54 of layer 52/54. Second conductive layer 56/58 is patterned to remove conductive material along a line 56-58, preferably straight, (labeled in FIG. 5b) which extends beneath crenellated line 52-54 such that portions of crenellated line 52-54 are above portions of layer 56/58 on both sides of line 56-58. Line 56-58 thereby divides layer 56/58 into two regions, region 56 and region 58. Region 58 is located generally beneath region 52 of layer 52/54 and region 56 is located generally beneath region 54 of layer 52/54.

Once conductive region 56 and conductive region 58 have been formed with the conductive material along line 56-58 removed, regions 56 and 58 can be used to electrically test the operation of the cell. This is done by placing a probe on each of these two regions 56 and 58, then shining a light on the top surface of semiconductive layer 51 and measuring the resulting current and voltage sensed by the two probes.

Elements along diagonal A—A of FIG. 5a can be seen in FIG. 5b. The current flow paths can also be clearly seen. For example, electrons collected by n-well 51n1 in crystal 51 move through conductive contact pad 52n1 to conductive extension 58n1, through region 58 of layer 56/58 and into bus bar 64. Electrons collected by n-well 51n9 move through conductive contact pad 54n9 in conductive region 54 of layer 52/54, travel horizontally toward finger tip 54e, move through extension 58c in second conductive layer 58 and into bus bar 64. A similar figure to FIG. 5b taken along a cross section through p-wells would show that holes collected by p-wells of crystal 51 move to bus bar 62.

Another important feature of this invention is shown in FIG. 5b. Passivation layer 61 is applied to the top surface 51t and side surfaces such as 51b of solar cell 50 after a wafer containing solar cell 50 has been divided into dice.

Solar cells such as cell 50 are generally formed as dice of a wafer (not shown) having many identical cells located side by side. Cell 50 is shown as square but can also be rectangular or any other appropriate shape.

Formation and patterning of layers 51, 55, 52/54, 53, and 56/58 of cell 50 shown in FIGS. 5a and 5b is performed while the dice of the wafer are still connected. After formation and patterning of layer 56/58, the wafer is then divided into dice such as cell 50 by separating the wafer at edges such as 51a, 51b, 51 c, and 51d.

Dividing into dice can be accomplished by scribing the wafer along lines which will become the edges such as 51a, 51b, 51c, and 51d of cell 50, then breaking the wafer along these scribe lines into individual cells such as cell 50. Scribing and breaking generally causes damage at edges such as 51a, 51b, 51c, and 51d of cell 50. If left untreated, these damaged areas will cause decreased efficiency of cell 50 near edges 51a, 51b, 51c, and 51d. Therefore, in a preferred embodiment, an etching step follows the scribing and breaking to remove damaged material from edges 51a, 51b, 51c, and 51d of cell 50. This etching may simultaneously remove damaged material from edges 51a, 51b, 51c, and 51d of cell 50 and thin cell 50 by also removing material from top surface 51t. Alternatively, a protective mask may be applied to top surface 51t before scribing and breaking, so that the subsequent etching step removes material only from sides 51a, 51b, 51c, and 51d of cell 50.

Dividing the wafer into dice can also be accomplished by masking the top surface of the wafer, patterning to expose lines along which dice will be separated, and etching through the entire thickness of the structure to form cells such as cell 50. Because of the time required for a deep etch and the amount of etching material required, the scribing and etching combination is usually preferred. But direct etching avoids damage to edges of the cell and may be preferred in some situations.

After etching the sides 51a, 51b, 51c, and 51d of cell 50 and possibly the top surface of 51t of cell 50, a passivation layer 61 (see FIG. 5b), preferably comprising silicon dioxide followed by silicon nitride, is applied to the top 51t and sides 51a, 51b, 51c, and 51d of cell 50. This passivation layer 61 serves as an antireflection coating to the top surface 51t of crystal 51, which faces the sun, thus increasing the amount of solar energy processed by cell 50. Antireflection coatings have been used in various prior art cells. Applying passivation layer 61 to edges 51a, 51b, 51c, and 51d of cell 50 after separating into dice is novel to the present invention and achieves a large increase of efficiency because the electrons and holes generated by solar energy do not recombine on the cell edges, but rather travel back to the interior of crystal 51 where they again face capture by one of the n wells or p wells. Testing on a cell of the prior art construction shown in FIG. 3a in which the was 1 cm × 1 cm and had an active area 0.8 cm × 0.8 cm showed that applying a passivation layer to edges of this prior art cell achieved a 20% increase in power output. Testing has not yet been performed on a cell constructed according FIG. 5a, however, since the active area extends almost to the edges of 51a, 51b, 51c, and 51d of cell 50, the improvement provided by passivating cell edges 51a, 51b, 51c, and 51d of cell 50 is expected to exceed 20%.

Though FIG. 5a shows crenellated dividing line 52-54 running along the diagonal of square crystal 51, this dividing line can, if desired, run perpendicularly between opposite sides of the crystal, and of course the crystal can be of another shape than square. The diagonal dividing line 52-54 in cell 50 has the benefit of orienting crystal 51 with a hard break crystallographic direction extending across the separation between bus bars 62 and 64. This reduces the likelihood of crystal 51 cracking along insulation layer 67 at the junction between bus bars 62 and 64. It is essential that the crenellated finger tips such as 52e of p-well contact region 52 be located above p-bus bar 62 and the crenellated finger tips such as 54e of n-well contact region 54 be located above n-bus bar 64 in order to achieve proper electrical contact. Advantageously, lengthwise (in the lengthwise direction of insulation 67) location of solar cell 50 on bus bars 62 and 64 is not critical. Bus bars 62 and 64 are shown as offset, a presently preferred embodiment, in order to provide attachment to electrical conduit (not shown) which will connect a long array of adjacent solar cells, but other means of electrically contacting the conduit can also be provided.

Figure 6A:
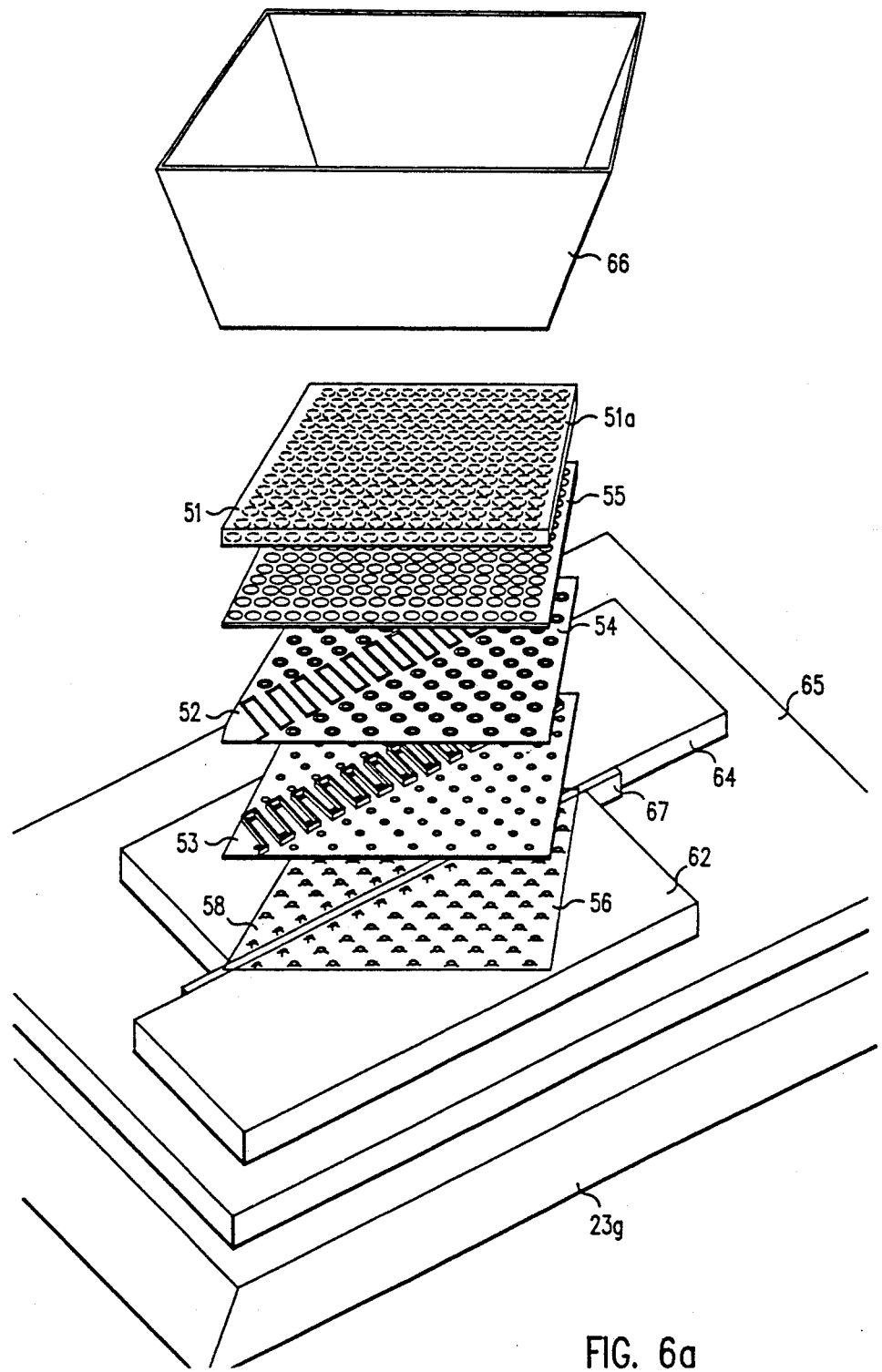
FIGS. 6a and 6b show alternative solar cell mounts of the current invention in which electrically insulated heat spreaders are located beneath bus bars of opposite polarity.
Figure 6B:
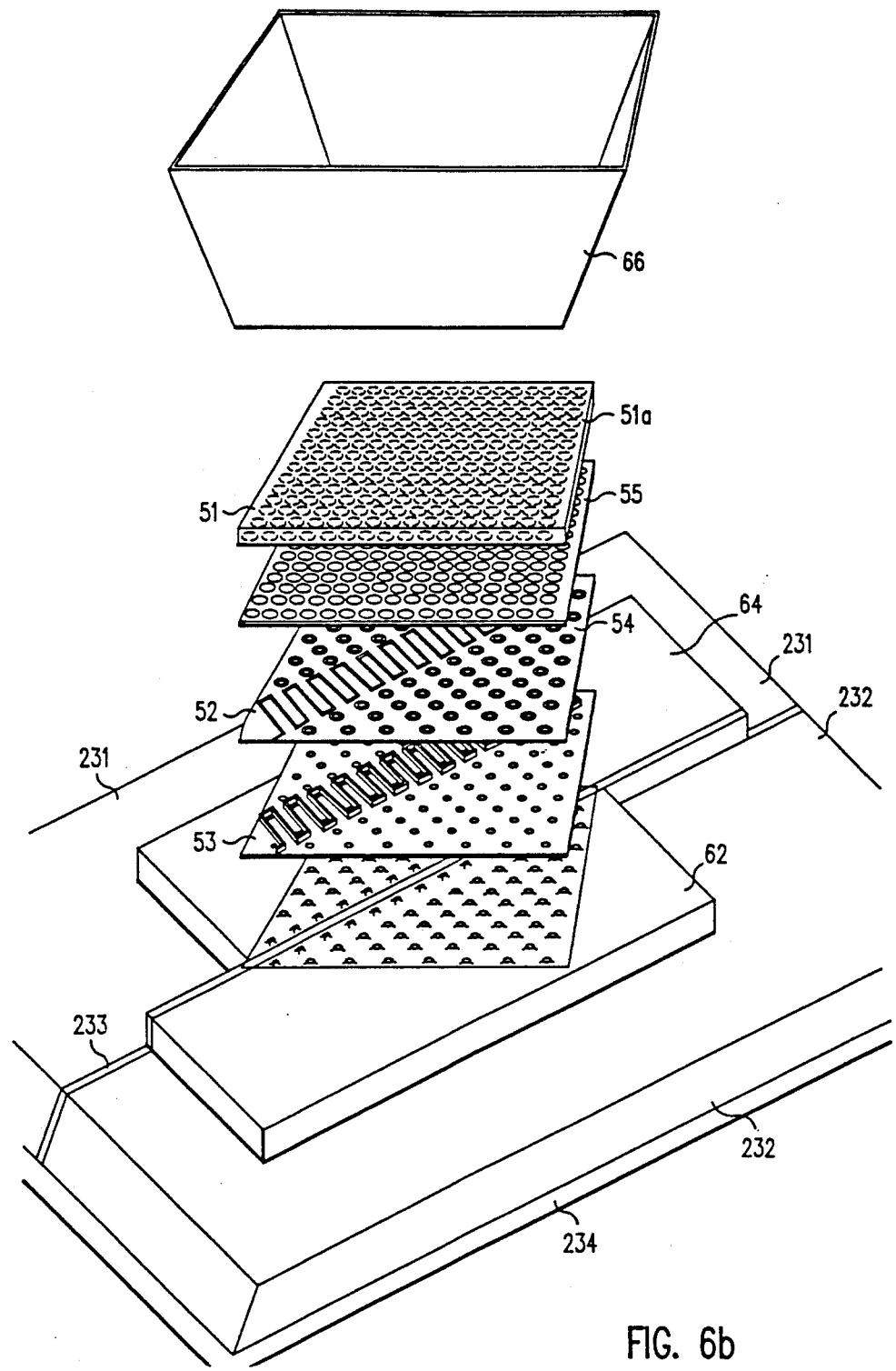

As shown in FIG. 6a, bus bars 62 and 64 are supported on electrical insulation layer 65 which is in turn supported on heat spreader 23g of a thermally conductive material, preferably metal. Alternatively, as shown in FIG. 6b, electrical insulation layer 65 of FIG. 6a can be eliminated if the single heat spreader 23g is replaced by two heat spreaders 231 and 232, separated vertically by electrically insulating divider 233. In the embodiment of FIG. 6b, insulation layer 234 beneath heat spreaders 231 and 232 must be provided in order to separate the electrically positive regions of the cell from the electrically negative regions of the solar cell.

Figure 7:
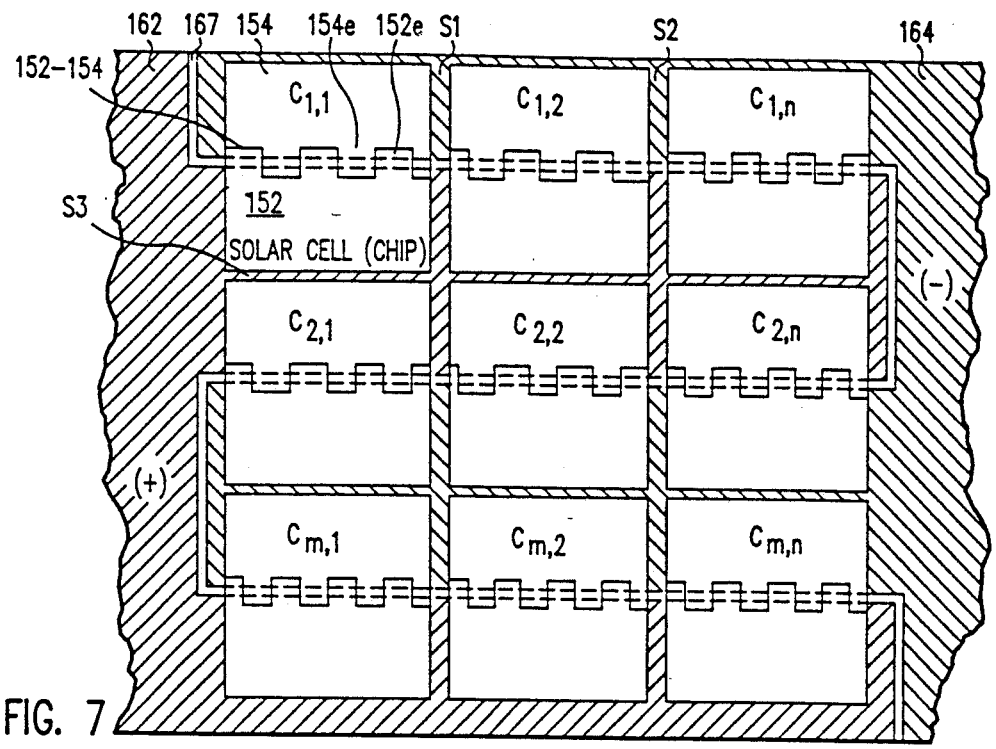
FIG. 7 shows a solar structure of this invention in which multiple solar cells are placed adjacent to each other.

FIG. 7 shows a layout in which multiple cells $C_{1,1}$ through $C_{m,n}$ are located adjacent to one another in an array. Bus bars 162 and 164 are interdigitated bars separated by narrow spaces in which electrical insulation 167 is provided. Each cell $C_{1,1}$ through $C_{m,n}$ contacts both buss bars 162 and 164, in the same manner as the cell shown in FIG. 5a. The particular array shown in FIG. 7 is 3×3. However, as indicated by the numbering of cells in FIG. 7, another number of cells could be used.

In FIG. 7, parts of cell $C_{1,1}$ are labeled in a manner similar to cell 50 of FIG. 5a. P-contact region 152 of FIG. 7 performs the same function as p-contact layer 52 shown on FIG. 5a. N-contact region 154 of FIG. 7 performs the same function as n-contact layer 54 shown in FIG. 5a. In FIG. 5a, the crenellated divider 52-54 is shown as located along a diagonal of cell 50, and in FIG. 7 crenellated dividers such as 152-154 are shown as bisecting each cell from the center of one side to the center of the opposite side.

Figure 1:
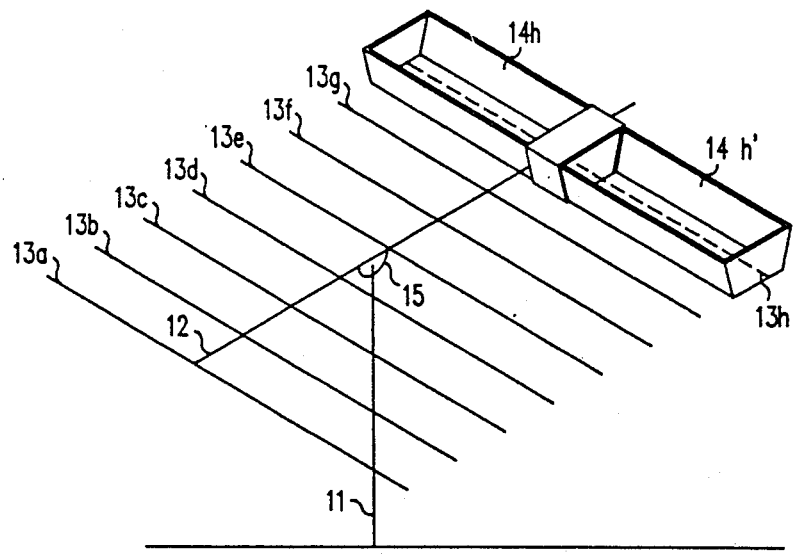
FIG. 1 shows a prior art representation of a solar tracker.
Figure 2:
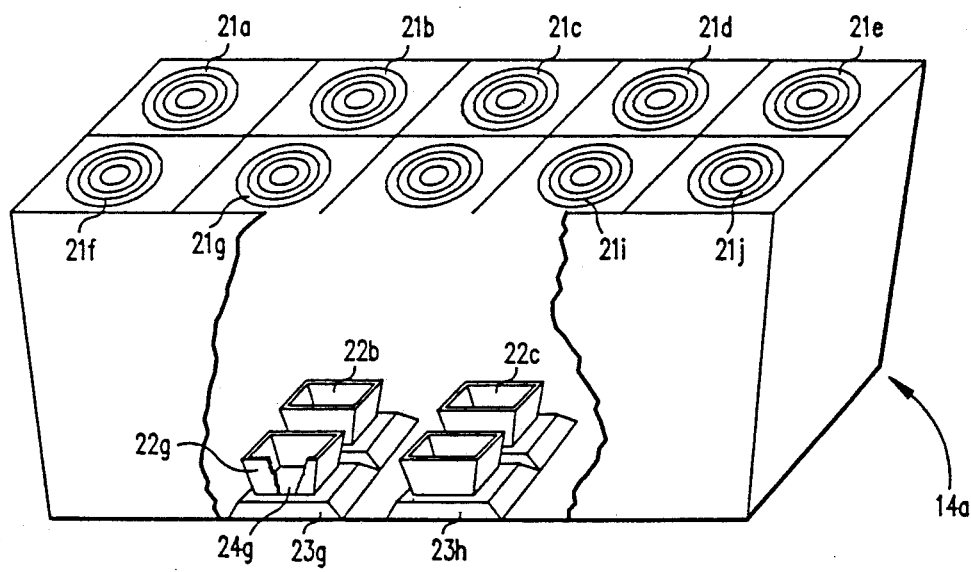
FIG. 2 shows a prior art solar cell tub.

FIG. 7 does not show a secondary optical element such as shown in FIG. 5a and discussed above in conjunction with the prior art. However, by use of such an element surrounding the entire array of cells $C_{1,1}$ through $C_{m,n}$, it is possible to improve efficiency and reduce sensitivity to error in pointing the array toward the sun for the multiple cell array of FIG. 7, as in single cell 50 of FIGS. 5a and 5b. A single large secondary optical element surrounding the entire array can reflect any energy misdirected from a Fresnel lens such as shown in FIG. 2, or other concentrating means, onto the active area represented by the array of solar cells $C_{1,1}$ through $C_{m,n}$. However, with multiple adjacent cells, the alignment between the Fresnel lens or other concentrating means and the solar cells is less critical, and the need for a secondary optical element is also less critical. Only a minimum separation, represented by spaces S1, S2 and S3, for example, is needed between adjacent cells $C_{1,1}$ through $C_{m,n}$, so that very little energy is lost to intervening spaces such as S1, S2 and S3.

Figure 9:
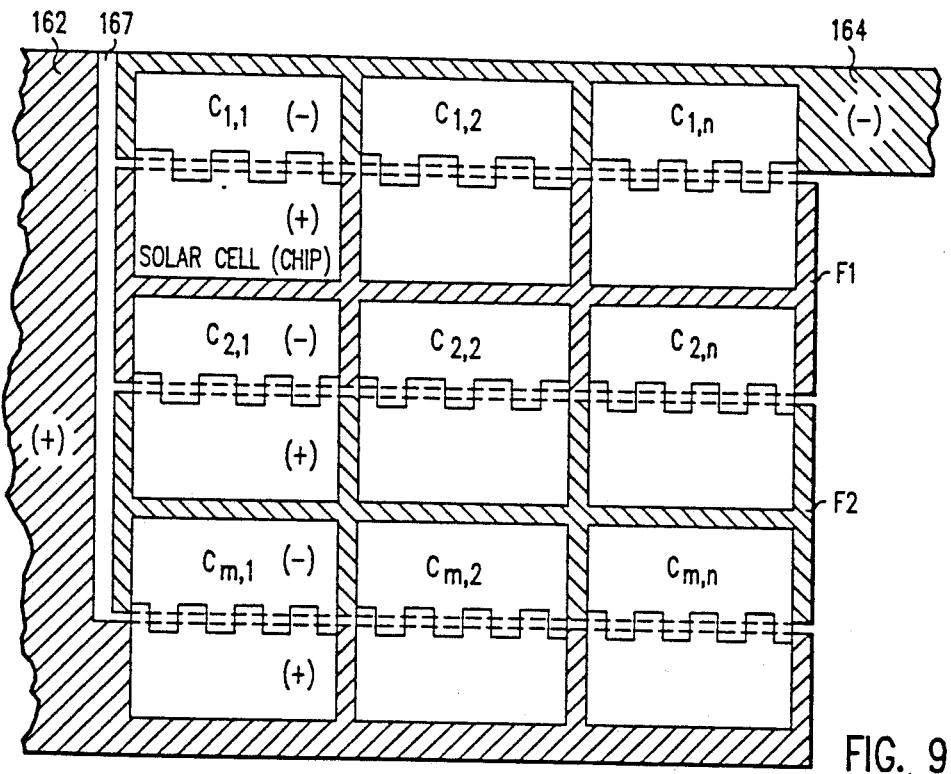
FIG. 9 shows a solar structure of this invention in which multiple cells are connected in series and parallel to achieve a selected output voltage and current.

FIG. 9 shows an embodiment which provides higher voltage and lower current than that of FIG. 7 by using two floating bus bar sections F1 and F2. FIG. 9 is like FIG. 7 except for the way the bus bar sections are connected. The principle of using floating bus bar sections such as F1 and F2 as shown in FIG. 9 can produce a solar cell structure having a voltage which is any integer multiple of voltage generated by a single solar cell. Additionally, multiple cells are provided in parallel, (for example, $C_{1,1}$, $C_{1,2}$ and $C_{1,n}$ as shown in FIG. 9) thus achieving both increased power and redundancy. The three cells $C_{1,1}$, $C_{1,2}$ and $C_{1,n}$ provide three times the current and therfore three times the power of a single cell. With the redundancy, if one of the parallel cells should fail the total available power from the structure is decreased, however the structure continues to operate and continues to provide the same operating voltage as before a cell failed.

Of course for configurations having move than two bus bars, such as bus bars 164, F1, F2 and 162 shown in FIG. 9, or interdigitated bus bars such as bus bars 162 and 164 shown in FIG. 7, an appropriate corresponding patterning of the packaging portion of the solar cell structure, including elements equivalent to bus bars 62 and 64, insulation 65 and 67 and heat spreader 23g of FIG. 6a, is provided.

Figure 8A:
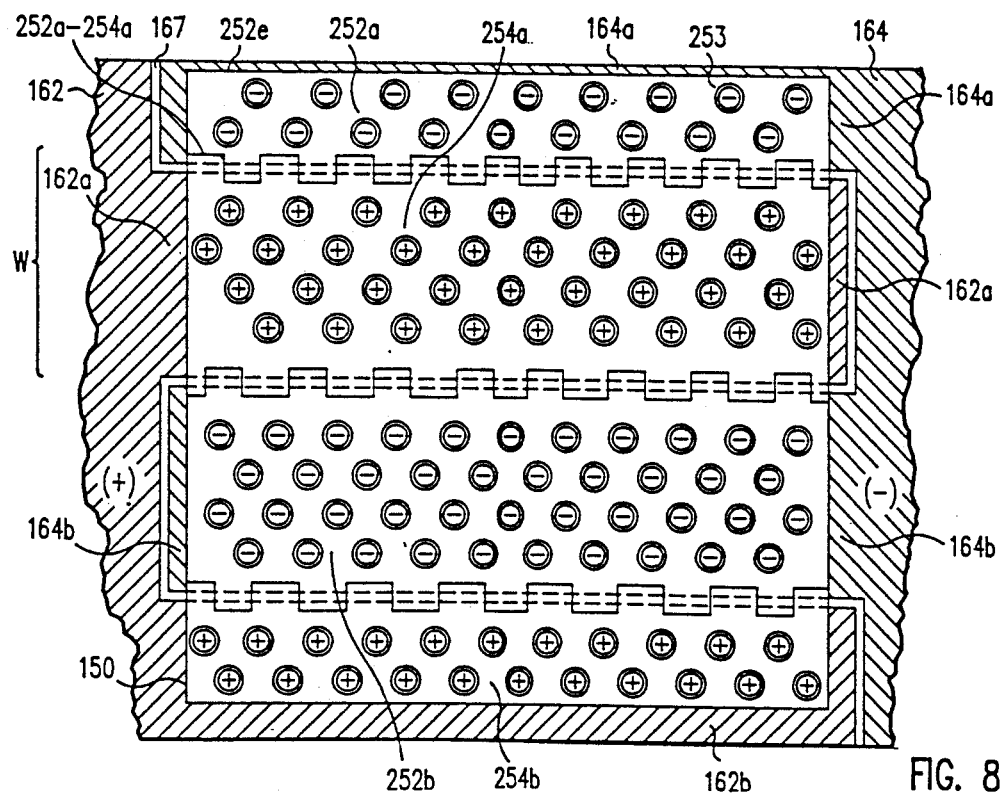
FIG. 8a shows a solar structure of this invention in which a large solar cell straddles multiple bus bar fingers of alternating polarity.

Other arrangements are also possible, for example, the arrangement shown in FIG. 8a in which a single cell 150 spans multiple adjacent fingers of interdigitated negative and positive bus bars 164 and 162. Successive fingers of bus bar 162 are labeled 162a and 162b. Successive fingers of bus bar 164 are labeled 164a and 164b. Only two fingers of each bus bar are shown in FIG. 8a extending beneath cell 150, however a considerably larger number of fingers may extend beneath the surface of a single solar cell.

The width W of the fingers 162a, 162b, 164a, and 164b determines the maximum length an electron or hole must travel from the well where it is collected through a perforated metal layer to a low resistance bus bar finger 162a, 162b, 164a or 164b. By forming multiple fingers of fairly narrow width, the ohmic loss from electron travel through the perforated metal layers of the solar cell can be minimized. Note that when fingers, for example fingers 164a and 164b, are provided on both sides of a metallization region, for example region 254a, electrons must travel less than half the width W of the metallization region such as 254a to reach a low resistance bus bar finger 164a or 164b.

Figure 8B:
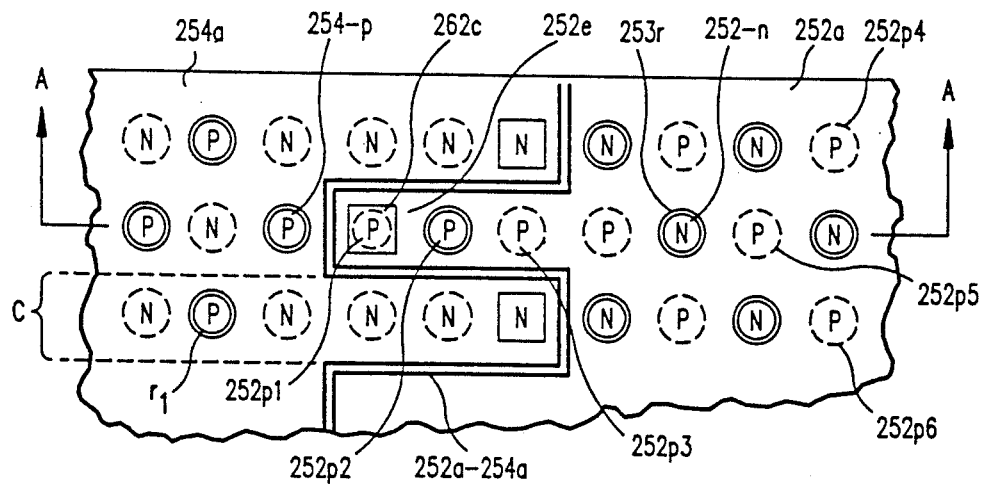
FIGS. 8b and 8c show in more detail a portion of the structure of FIG. 8a taken near one of the crenellated lines.
Figure 8C:
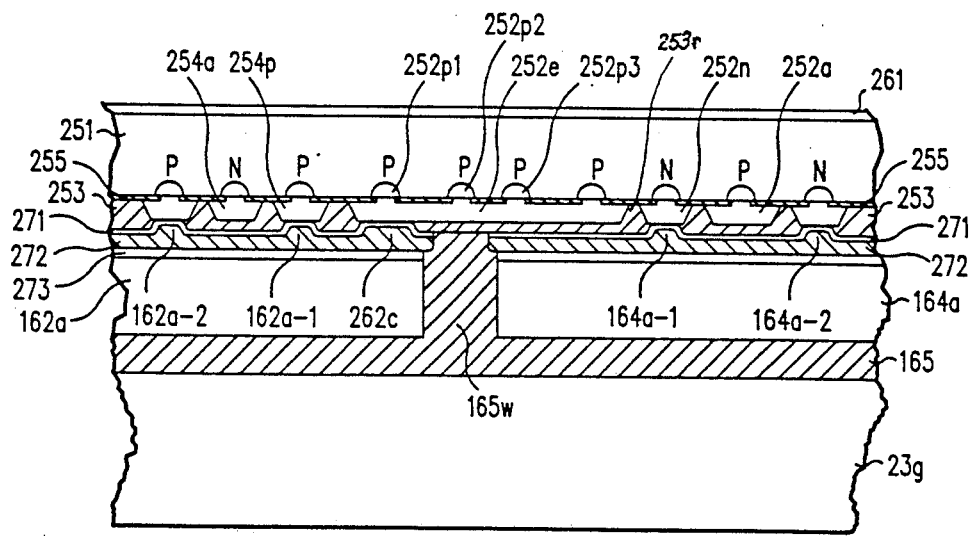

FIGS. 8b and 8c show in detail the structure of FIG. 8a in the region of crennellated line 252a-254a. FIG. 8b shows a top view in the region of crenellated line 252a; 254a and FIG. 8c is a cross section of this same region taken along the line A—A of FIG. 8b.

As hown in FIGS. 8b and 8c, the crystal pattern of semiconductor crystal 251 is altered in the region of crenellated line 252a-254a because the extensions such as extension 252e must carry large currents. Extention 252e is one of many extensions from p-contact region 252a. As shown in FIG. 8b, the pattern of n-wells and p-wells is changed in the region of crenellated line 252a-254a. Therefore, there are no perforated rings such as ring 253-r and contact pads such as pad 252-n used in extension 252e, in order to avoid decreasing the cross sectional area of metal available for carrying current through extension 252e, from all p-wells such as p-wells 252p5, and possibly 252p4 and 252p6 for which extension 252e is the closest collector. At the tip of extension 252e beneath p-well 252p1, is bus bar contact 262c, which carries current from p-contact region 252a to p-bus bar 162a.

The altered bus bar pattern produces only a slight decrease in efficiency if the width c of crenellation 252a-254a is small relative to the spacing between adjacent wells. FIG. 8b shows only one row of wells in extensions such as 252e, however it is possible to space the crenellations with a plurality of rows of wells per extension, and having two rows per extension is presently preferred.

The particular cross section in FIG. 8c shows a plurality of adjacent p-wells 252p1, 252p2, and 252p3 in extension 252e extending to the left across insulation wall 165w. A different side view taken at one of the extensions in n-contact region 254a would show a plurality of adjacent n-wells extending to the right across insulation wall 165w to contact negative bus bar 164a.

All embodiments of this invention provide adjacent electrically separated perforated metallization regions. The main body of each of these perforated regions makes contact with semiconductor wells of one polarity and has extensions which reach across to contact a bus bar or bus bar finger on the opposite side of the cell of the correct polarity. Semiconductor wells having the same polarity as bus bar fingers beneath them make contact with these bus bar fingers through holes in the intervening perforated metallization regions.

In the past, solar cells of large size had a short life because thermal gradients and material incompatibilities would cause early failure. However, with the present geometry and with carefully selected materials having very similar and preferably small coefficients of thermal expansion, a reliable cell of much larger size can be manufactured and the operating life of a cell of the original size can be extended. Whereas previous cells were 0.8 cm to 1 cm on a side, cells 5 cm are now considered practical if made in accordance with this invention.

In one embodiment, the solar cell of FIGS. 5a, 5b, 6a or 6b is 1 cm on a side and is used with a Fresnel lens about 23 cm on a side, some 20 cm away from the cell.

This provides a 500 sun concentration on each solar cell.

There are other benefits to use of a larger cell, such as relaxation of tolerance requirements in cell-to-lens alignment. In a cell of 1 cm width, a system having an alignment error such that a Fresnel lens is adjusted to focus 0.3 cm from the center of the cell may have the same percent degradation as a misalignment of 1.5 cm in a 5 cm cell.

It is important that the various insulating, semiconductive, and conductive layers forming the sandwich of the solar cell and mounting structure have similar thermal expansion coefficients, so that diurnal temperature changes do not result in internal stresses and early failure. Materials which have thermal expansion coefficients similar to silicon are Kovar and molybdenum.

In a preferred embodiment, crystal 51 (FIG. 5a) is of silicon, insulation layer 55 is silicon dioxide, regions 52 and 54 are formed in a first metal layer of aluminum, or an aluminum-silicon alloy, and insulation layer 53 is of silicon dioxide glass. After patterning of the glass to expose pads leading to wells in the silicon crystal 51, a thin conductive layer 56/58 (200–400Å) of nickel is vacuum or sputter deposited onto the surface which is comprised of insulation layer 53 and exposed portions of first metal regions 52 and 54, in order to make a wettable surface for solder contact. A tin-lead-silver solder is then formed on the surface of bus bars 62 and 64 which are preferably of nickel plated molybdenum. This solder bonds bus bars 62 and 64 to, and forms electrical contact with, conductive layer 56/58.

In a preferred embodiment of the structure shown in FIG. 8c, crystal 251 is of silicon, approximately 100 microns thick, having an antireflection coating 261 on its top and side surfaces. (See FIG. 5b for an illustration of antireflection coating 61 extending to side surfaces of the crystal.) N-wells and p-wells formed in the lower surface of crystal 251 are 20-30 microns apart, producing a spacing of some 30 –45 microns between wells of the same conductivity type. The well regions are 10–15 microns across. The first metal layer forming regions 252a and 254a is aluminum or an aluminum alloy, approximately 1-2 microns thick. The patterned rings such as ring $r_1$, shown in FIG. 8b, surrounding contact pads of the opposite conductivity type in the first metal layer are 15–20 microns across, with the contact pads 8–10 microns across.

Bus bars 162 and 164 together with contacts and their metallization such as 162a-1, 164a-1 and 262c preferably comprise five stacked metal layers of aluminum alloy 254, nickel 271, solder 272, nickel 273, and molybdenum 162a or 164a. Insulation 253 and 255 are preferably silicon dioxide 2 to 3 microns thick. Thin nickel layer 271 is preferably 200–400Å thick and extends into the vias at locations such as 162a-1, 162a-2, 262c, 164a-1 and 164a-2 to make contact with the aluminum first metal layer. Thin nickel layer 271 is patterned not to extend across the region above insulating wall 165w between bus bars 162a and 164a. This insulation wall is composed of a sealing glass 100–200 microns wide. Onto thin nickel layer 271 is formed tin-lead-silver (62.5% tin, 36.1% lead, 1.4% silver) solder layer 272, 25–75 microns thick. The aspect ratio of the vias is such that the solder connects to the nickel at the sides as well as the bottom of the vias.

Bus bars 162 and 164 are preferably of molybdenum. Molybdenum has a thermal expansion coefficient similar to that of silicon crystal 251 and of silicon dioxide layer 253. Since failure of solar cell crystals has frequently been due to fatigue from thermal expansion, it is important that the thick layers of the solar cell structure have similar thermal expansion coefficients. On the top surface of the bus bars is nickel layer 273. When the structure is complete, nickel layer 273 contacts solder layer 272, producing the five stacked metal layers of aluminum alloy 252 or 254, nickel 271, solder 272, nickel 273 and molybdenum 162a or 164a shown in FIG. 8c.

In one preferred embodiment, the package including bus bars 62 and 64 (FIGS. 5a–6b) and intervening insulation 67 is formed as a separate unit, and the die including solar cell crystal 51 with first metallization layer including regions 52 and 54, insulation layer 53 and the nickel/solder layer forming metal contacts such as 62p, 62c, 64n, and 64c is formed as another separate unit. These units are then combined to form a finished solar device.

A method of making the solar cell die which achieves good yield comprises forming the semiconductor crystal portion 51 (see FIGS. 5a and 5b) of the solar cell, applying and patterning an insulation layer 55, doping and diffusing into the exposed bottom surface of crystal 51 n-wells and p-wells, depositing and patterning the first metal layer containing perforated metallization regions 52 and 54, forming insulation layer 53, thinning the wafer by chemical etch, and forming vias and metal contacts such as 64a which reach through insulation layer 53, all as part of an integrated circuit chip or integrated circuit wafer.

A preferred method of making the solar cell structure is now described in more detail in connection with FIG. 8c. Into the passivated bottom surface (as oriented in FIG. 8c) of semiconductor crystal 251 are doped the n-wells and p-wells in the pattern discussed earlier. The first layer of metal, preferably aluminum, is deposited and patterned to form contact regions 252a and 254a including a plurality of contact pads such as 252n and 254p. Insulation layer 253, preferably silicon dioxide, is formed, and vias are patterned into insulation layer 253. Next, thin nickel layer 271 is vacuum deposited onto the surface of the patterned glass insulation layer 253. Since the separation between the two regions contacted by nickel layer 271 is on the order of 100–200 microns, and the dividing line in the preferred embodiment is straight, a shadow mask may be used when depositing the nickel. Alternatively, of course, photolithographic masking and etching after deposition can be used.

The wafer is then cut into dice. The dice are etched at their sides, as discussed earlier in connection with FIGS. 5a and 5b, and are placed nickel side down onto a holding fixture and put into a furnace at a temperature of about 300° C. A thin layer of silicon dioxide about 120Å thick is deposited onto the top and sides of the dice. This is followed by deposition of 640Å of silicon nitride onto the top and sides. These steps serve to provide antireflection coating 261 to the top of the cell, which improves the collection of solar photons and reduces recombination of charge carriers. Importantly it also serves to passivate the sides of the cell (See FIG. 5a and 5b, side region 51a, 51b, 51c and 51d) so that electrons and holes moving toward the edges will not recombine or escape from the edges but will be reflected back toward wells where they will be collected. Thus the efficiency at the edges remains approximatley as high as the efficiency in the interior of the crystal. Tin-lead-silver solder 272 is then deposited on the thin nickel layer to complete the second conductive layer of the solar cell.

The solar cell dice are then ready for attaching to the bus bar and heat spreader package.

According to the method of forming the package shown in FIG. 6a, a molybdenum heat spreader 23g is coated with an insulating layer 65 such as a spin-on glass or sealing glass frit common to the semiconductor industry, 10 to 30 mils in thickness. A low temperature bake of 80°-100° C. follows to partially cure the glass for ease of handling. Next, two molybdenum bus bars 62 and 64 along with a dielectric spacer 67, which can be either sacrificial or permanent, are placed on heat spreader 23g and held in place. The combined assembly is then fired in a furnace at about 500° C. to form a bond among the three molybdenum parts 62, 64, and 23g but retain electrical isolation between the bus bars. Bus bars 62 and 64 are then plated with a solderable material, such as an electroless nickel coating, preparatory to final soldering to the solar cell die. This nickel layer, equivalent to nickel layer 273 of FIG. 8c, does not have to be thin as does nickel layer 271 of FIG 8c to conform to an intricate pattern, and therefore may be plated onto the bus bars 62 and 64 (or 162 and 164 of FIG. 8c) rather than sputter or vacuum deposited. The solar cell die is then placed in proper registration to the gap between bus bars 62 and 64, and the adjoining layers of nickel 273 and solder 272 are reflowed in an appropriate furnace. A forming gas atmosphere (93% nitrogen, 7% hydrogen) may be used in the furnace to maintain low surface recombination velocity in the solar cell and to deter oxidation of the solderable surfaces during reflow.

Alternatively, the package assembly shown in FIG. 6b makes use of two molybdenum blocks 231 and 232 separated by an insulating material 233 such as the above mentioned glass. This glass also coats the bottom 234 of the two blocks in order to provide electrical isolation from the housing. After firing of this assembly, the two terminals 62 and 64 can be delineated, if required, by simple masking and etching, or blocks 232 and 231 can serve as bus bars themselves. Plating and solder bonding is as described with respect to FIG. 6a above.

Figure 10A:
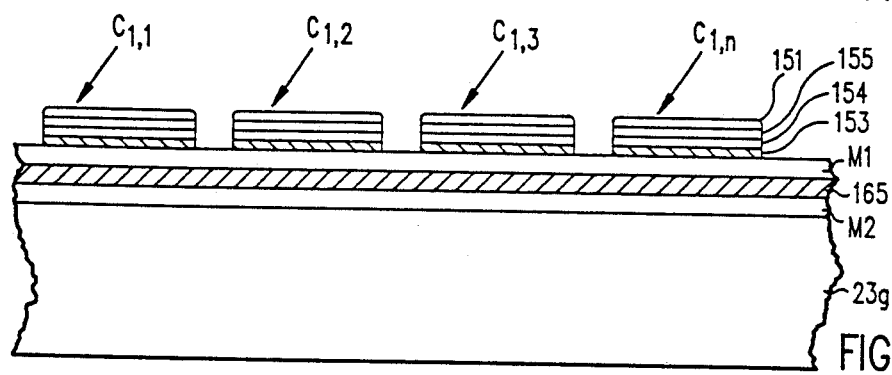
FIGS. 10a and 10b show a solar structure of this invention in which multiple solar cell dice are placed on a bus bar support structure of 3-layer sandwich construction.
Figure 10B:
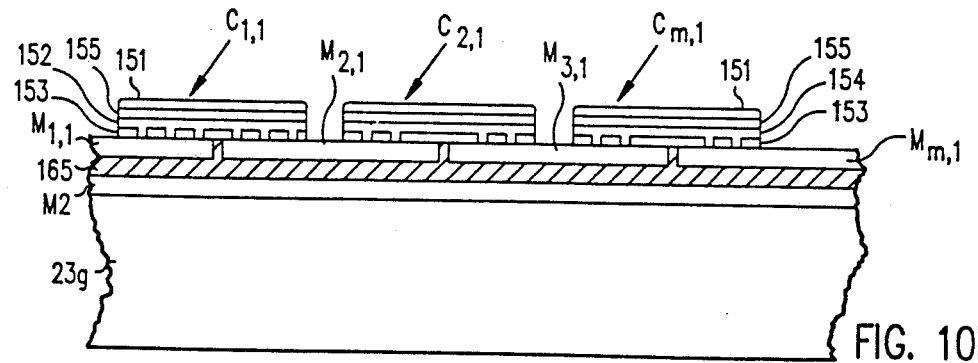

As a further alternative shown in FIGS. 10a and 10b, structures similar to FIG. 6a and 6b can be fabricated from three separate units. The solar cell die unit is the same as that discussed with respect to FIGS. 8a and 8b above. The next unit is a molybdenum-glass-molybdenum sandwich comprising molybdenum layer M1, glass layer 165, and molybdenum layer M2 formed and patterned using semiconductor fabrication techniques. The first layer of molybdenum M1 serves to form the bus bars such as 62 and 64 of FIGS. 5a, 5b, 6a, or 6b. The glass layer 165 serves as a dielectric as does glass layer 65 of FIG. 6a. Layers 151, 155, 152, 153, and 154 of FIGS. 10a and 10b are equivalent to regions 51, 55, 52, 53, and 54, respectively, of FIG. 5a and FIG. 6a. The second layer of molybdenum M2 completes the sandwich making the unit more rugged during fabrication. This middle unit is attached to the third unit comprising molybdenum heat spreader 23g using a thin high temperature solder (melting point around 385° C.). As shown in FIG. 10a, several solar cell dice C1,1, C1,2, . . . C1,n can be placed side by side spanning the same pair of bus bars. And, as shown in FIG. 10b, several bus bars M1,1, M2,1, M3,1, Mm,1 can be located side by side in metallization layer M1. This layer M1 of molybdenum is patterned to form bus bars M1,1, M2,1, M3,1, . . . Mm,1. The semiconductor fabrication techniques used in layer M1 facilitate the alignment with solar cell dice, particularly important with multiple cells and multiple bus bar structures. Indeed the more rugged sandwich construction is particularly advantageous for such an application.

The molybdenum-glass-molybdenum sandwich is prefabricated with the size of the sandwich and thickness of each layer dependent on current level and dielectric isolation needed. As discussed earlier, the patterning of layer M1 can be selected for series or parallel coupling of adjacent solar cells for any combination of voltage and current and any level of redundancy required.

Finally the dice are attached to the package as discussed earlier.

Secondary optical element 66 is attached using an electrical insulator to bus bars 62 and 64. Alternatively, secondary optical element 66 may be attached to the heat spreader. Either attachment allows for a rugged structure. With the structure of this invention, it is possible to have considerable freedom in the lengthwise positioning of the integrated circuit structure with respect to the bus bars or bus bar fingers.

The present invention provides an improvement over the prior art in simplifying the number of process steps and decreasing the chance of defects.

In the prior art structures such as those described in the Swanson patent, the Sinton dissertation, or the Sinton et al paper, supra, process steps for forming the solar cell die include growing and patterning an insulation layer on the semiconductive layer, depositing and patterning a first metal layer followed by depositing and patterning a dielectric layer, followed by depositing and patterning a second metal layer to which is applied a layer of nickel followed by a layer of solder which attaches to the bus bar structure. The major failure in the solar cell structure made by this prior art process is shorting between the first and second metal layers. This shorting occurs because the dielectric must be kept thin (about 1 micron) in order to maintain an aspect ratio in which second metal will extend continuously into the dielectric vias. This in turn results in a low yield.

By contrast, after depositing and patterning first metal and the dielectric layer, rather than depositing and patterning a conventional second layer of metal, the preferred embodiment of the present invention provides forming the nickel layer by vacuum deposition or sputtering directly against the patterned dielectric and exposed first metal. The yield is improved in the current invention compared to the prior art process above because a thicker (about 2 to 3 micron) dielectric layer can be used since the nickel and solder combination can conform to the higher aspect ratio in the vias of the thicker dielectric. Additionally the cost is lower because a second layer of aluminum does not have to be deposited, masked, and patterned.

It will be obvious to those skilled in the art that in light of the above description, other embodiments incorporating the principals of this invention are possible. Such other embodiments are intended to fall within the scope of this invention.

We claim:

1. A point contact solar device comprising:
   a semiconductive layer having a top surface, a bottom surface and sides;
   wells of p-conductivity type and n-conductivity type formed in said semiconductive layer in an alternating pattern, said wells extending to said bottom surface;

an insulating layer formed on said bottom surface of said semiconductive layer and patterned to expose surfaces of said wells of p-conductivity type and n-conductivity type;

a conductive layer comprising at least two conductive regions formed on and in contact with said insulating layer, said regions comprising at least one positive conductive region and at least one negative conductive region, said at least one positive conductive region being patterned so as to contact only those of said wells of p-conductivity type located above said positive conductive region, and said at least one negative conductive region being patterned so as to contact only those of said wells of n-conductivity type located above said negative conductive region;

a pair of electrically separated bus bars each having a top surface, a bottom surface, and sides, located side-by-side beneath said conductive layer, comprising one positive bus and one negative bus;

said positive bus extending beneath and being electrically separated from said at least one negative conductive region, and said negative bus extending beneath and being electrically separated from said at least one positive conductive region;

said conductive regions further comprising interleaved fingers with tips, the tips of said fingers of said at least one positive conductive region being located above and in electrical contact with said positive bus and the tips of said fingers of said at least one negative conductive region being located above and in electrical contact with said negative bus; and means for electrically connecting those of said wells of p conductivity type not electrically connected to said positive conductive region to portions of said positive bus bar located beneath said wells of p conductivity type, and means for electrically connecting those of said wells of n-conductivity type not electrically connected to said negative conductive region to portions of said negative bus bar located beneath said wells of n-conductivity type.

2. A point contact solar device as in claim 1 in which each of said bus bars is approximately rectangular in shape, said at least one positive and negative conductive regions comprise one positive conductive region and one negative conductive region, and approximately half of said semiconductive layer is located above an end of each of said bus bars.

3. A point contact solar device as in claim 2 in which semiconductive layer is approximately square in shape and the sides of said semiconductive layer run approximately parallel to the sides of said bus bars.

4. A point contact solar device as in claim 2 in which said semiconductive layer is approximately square in shape and said sides of said semiconductive layer run at a diagonal to the sides of said bus bars.

5. A point contact solar device as in claim 1 in which each of said bus bars comprises a plurality of fingers, the fingers of said positive bus being interdigitated with the fingers of said negative bus, and approximately half of said semiconductive layer being located above each of said plurality of fingers; said at least one positive conductive region being located above said fingers of said negative bus and said at least one negative conductive region being located above said fingers of positive bus.

6. A point contact solar device as in claim 5 in which said semiconductive layer is approximately square in shape and the sides of said semiconductive layer run appproximately parallel to the sides of said bus bar fingers.

7. A point contact solar device as in claim 5 in which said semiconductive layer is approximately square in shape and the sides of said semiconductor layer run at a diagonal to the sides of said bus bars fingers.

8. A point contact solar device as in claim 1 in which over 90% of said bottom surface of said semiconductive layer is adapted to convert solar radiation to electrical energy.

9. A point contact solar device as in claim 1 further comprising a secondary optical element surrounding but not attached to said semiconductive layer and adapted to reflect solar energy from the surface of said secondary optical element onto the surface of said semiconductive layer.

10. A point contact solar device as in claim 1 further comprising a heat spreader located beneath and electrically separated from said bus bars.

11. A point contact solar device as in claim 10 in which said heat spreader and said bus bars are made of molybdenum.

12. A point contact solar device as in claim 1 further comprising a pair of heat spreaders, electrically separated from each other, each located beneath one of said bus bars.

13. A point contact solar device as in claim 1 further comprising heat spreading means located beneath said bus bars adapted to remove sufficient heat from said solar device that said solar device operates efficiently and does not encounter thermal degradation.

14. A point contact solar device as in claim 1 in which a passivation layer is formed on the top surface and edges of said semiconductive layer.

15. A point contact solar device as in claim 1 further comprising an antireflection coating for said top surface of said semiconductive layer and a passivation region at said edges of said semiconductive layer.

16. A point contact solar device as in claim 1 in which the crystalline structure of said semiconductive layer is oriented such that a hard break crystallographic direction extends across edges of said positive and negative buses.

17. A point contact solar device as in claim 1 in which said means for electrically connecting comprises:

an insulation layer formed on the bottom surface of said conductive regions, said insulation layer having vias aligned with said holes in said positive and negative conductive regions and vias aligned with said tips of said fingers;

a solder wettable conductive layer formed on the bottom surface of said insulation layer and in contact through said vias with said wells of p-conductivity type and n-conductivity type in said semiconductive layer and being patterned such that electrical contact with said wells of n-conductivity type is insulated from electrical contact with said wells of p-conductivity type; and a layer of solder formed on the bottom surface of said solder wettable layer and patterned to align with said solder wettable layer.

18. A point contact solar device as in claim 17 in which said solder wettable conductive layer comprises nickel and said layer of solder comprises an alloy of tin, lead, and silver.

19. A point contact solar device as in claim 18 in which said solder alloy comprises approximately 62.5% tin, 36.1% lead and 1.4% silver.

20. A point contact solar device as in claim 1 in which said means for electrically connecting comprises:
- a plurality of positive contact pads formed in said conductive layer and surrounded by said at least one negative conductive region, said positive contact pads being located so that each of said positive contact pads contacts one of said wells of p-conductivity type:
- a plurality of negative contact pads formed in said conductive layer and surrounded by said at least one positive conductive region, said negative contact pads being located so that each negative contact pad contacts one of said wells of n-conductivity type;
- a second insulation layer formed on the bottom surface of said conductive layer and patterned to expose said positive and negative contact pads; and
- a layer of metallization formed on the bottom surface of said second insulation layer and patterned to have a positive portion contacting said positive contact pads, and a negative portion contacting said negative contact pads.

21. A point contact solar device as in claim 20 in which said layer of metallization formed on the bottom surface of said second insulation layer comprises a solder wettable layer adjacent said second insulation layer, and a solder layer adjacent said solder wettable layer.

22. A point contact solar device as in claim 21 in which said solder wettable layer is nickel and said solder layer is an alloy of tin, lead, and silver.

23. A point contact solar device as in claim 1 in which a passivation region is formed on the top and side surfaces of said semiconductive layer, said passivation region also comprising an antireflection coating on said top and sides.

24. A point contact solar device comprising:
- a plurality of laterally spaced apart semiconductive layers each having a top surface and a bottom surface;
- wells of p-conductivity type and n-conductivity type formed in each of said semiconductive layers in an alternating pattern, said wells extending to said bottom surface of each of said semiconductive layers;
- an insulating layer formed on said bottom surface of each of said semiconductive layers and patterned to expose said wells of p-conductivity type and n-conductivity type;
- a conductive layer comprising pairs of conductive regions located beneath and in contact with a bottom surface of each said insulation layer, each pair comprising one positive conductive region and one negative conductive region, said positive conductive region contacting approximately half of the associated insulating layer and said negative conductive region contacting approximately half of said insulating layer;
- said positive conductive region being patterned so as to contact only those of said wells of p-conductivity type located above said positive conductivity region, and said negative conductive region being patterned so as to contact only those of said wells of n-conductivity type located above said negative conductive region;
- a pair of electrically separated bus bar regions located side-by-side beneath said conductive regions, comprising one positive bus bar region and one negative bus bar region;
- said positive bus bar region extending beneath and being electrically separated from each of said negative conductive regions, and said negative bus bar region extending beneath and being electrically separated from each of said positive conductive regions;
- said conductive regions further comprising interleaved fingers with tips, the tips of said fingers of each of said positive conductive regions extending above and being in electrical contact with said positive bus bar region and the tips of said fingers of each of said negative conductive regions extending above and being in electrical contact with said negative bus bar region; and
- means for electrically connecting those of said wells not electrically connected to said positive conductive regions to portions of said positive bus bar region located beneath said wells of p conductivity type, and means for electrically connecting those of said wells of n conductivity type not electrically connected to said negative conductive region to portions of said negative bus bar region located beneath said wells of n conductivity type.

25. A point contact solar device as in claim 24 in which said plurality of laterally spaced semiconductor layers are located closely adjacent to one another.

26. A point contact solar device as in claim 24 further comprising a secondary optical element surrounding said plurality of semiconductive layers and adapted to reflect solar energy from the surface of said secondary optical element onto said surfaces of said semiconductive layers.

27. A point contact solar device as in claim 24 in which each of said bus bar regions has a plurality of fingers interdigitated with fingers of the other bus bar region of said pair.

28. A point contact solar device as in claim 24 in which each of said semiconductive layers is approximately square in shape and the sides of said semiconductor layers run approximately parallel to the sides of said bus bar fingers.

29. A point contact solar device as in claim 24 in which each of said semiconductive layers is approximately square in shape and the sides of said semiconductive layers run at a diagonal to the sides of said bus bars.

30. A point contact solar device as in claim 24 in which each of said semiconductive layers is oriented such that a hard break crystallographic direction in said semiconductive layers extends across edges of said positive and negative bus extending beneath said semiconductive layers.

31. A point contact solar device as in claim 17 further comprising a heat spreading means located beneath said bus bars and adapted to remove sufficient heat from said solar device such that said solar device operates efficiently and does not encounter thermal degradation.

32. A point contact solar device as in claim 24 in which said means for electrically connecting comprises:
- a plurality of positive contact pads formed in each of said conductive layers, surrounded by said at least one negative conductive region, said positive contact pads being located so that each of said positive contact pads contacts one of said wells of p-conductivity type;

a plurality of negative contact pads formed in each of said conductive layers, surrounded by said at least one positive conductive region, said negative contact pads being located so that each negative contact pad contacts one of said wells of n-conductivity type;

a second insulation layer formed on the bottom surface of each of said conductive layers and patterned to expose said positive and negative contact pads; and a layer of metallization formed on the bottom surface of said second insulation layer and patterned to have at least one positive portion contacting only said positive contact pads, and at least one negative portion contacting only said negative contact pads.

33. A point contact solar device as in claim 32 in which said layer of metallization formed on the bottom surface of said second insulation layer comprises a solder wettable layer adjacent said second insulation layer, and a solder layer adjacent said solder wettable layer.

34. A point contact solar device as in claim 33 in which said solder wettable layer is nickel and said solder layer is an alloy of tin, lead, and silver.

35. A point contact solar device as in claim 24 in which a passivation region is formed on the top and side surfaces of each of said semiconductive layers, each of said passivation regions also comprising an antireflection coating on said top and sides.

36. A point contact solar device as in claim 24 further comprising an antireflection coating on the top surfaces of each of said semiconductive layers and a passivation region at the edges of each of said semiconductive layers.

37. A point contact solar device comprising:
a plurality of solar cell dice, each die comprising:
a semiconductive layer in which are formed wells of p-conductivity type and n-conductivity type in an alternating pattern, said wells extending to a bottom surface of said semiconductive layer;
an insulating layer formed on the bottom surface of said semiconductive layer and patterned to expose said wells of p-conductivity type and n-conductivity type;
a conductive layer patterned to comprise a negative conductive region adjacent to approximately a first half of said insulation layer and in electrical contact with said wells of n-conductivity type in said first half of said die and a positive conductive region adjacent to approximately a second half of said insulation layer and in electrical contact with said wells of p-conductivity type in said second half of said die, said conductive layer further patterned to provide conductive pads in said first half electrically separated from said negative conductive region, and in electrical contact with said second half electrically separated from said positive conductive region, and in electrical contact with said wells of n-conductivity type;
a plurality of electrically separated bus bars, half of said bus bars being positive bus bars and half being negative bus bars;
each of said dice having said pads in said first half electrically connected to one of said positive bus bars and having said pads in said second half electrically connected to one of said negative bus bars.

38. A point contact solar device as in claim 37 in which said electrically separated bus bars are formed from at least one layer of molybdenum and adjacent to which is formed a layer of glass, which layer of glass is attached to a heat spreader of molybdenum.

39. A point contact solar device as in claim 37 in which said electrically separated bus bars are formed in one layer of molybdenum adjacent to which is formed a layer of glass attached to a heat spreader of molybdenum.

40. A point contact solar device as in claim 37 in which a passivation region is formed on the top and side surfaces of said semiconductive layer, said passivation region also comprising an antireflection coating on said top and sides.

41. A point contact solar device as in claim 37 further comprising an antireflection coating on the top surfaces of each of said semiconductive layers and a passivation region at the edges of each of said semiconductive layers.

42. A process for making a point contact solar device comprising:
forming in and adjacent the bottom surface of a semiconductive layer wells of p-conductivity type and n-conductivity type in an alternating pattern;
forming an insulation layer on the bottom surface of said semiconductive layer and patterning said insulation layer to provide openings exposing said wells;
forming conductive layer on said insulation layer;
patterning said conductive layer to comprise at least two conductive regions, said conductive regions comprising:
at least one negative conductive region and at least one positive conductive region, said at least one positive conductive region being patterned so as to contact only those wells of p-conductivity type located above said at least one positive conductive region, and said at least one negative conductive region being patterned so as to contact only those of said wells of n-conductivity type located above said at least one negative conductive region, said regions further comprising a plurality of positive contact pads surrounded by said negative conductive region, each of said positive contact pads contacting one or said wells of p-conductivity type located above said at least one negative conductive region, and a plurality of negative contact pads surrounded by said positive conductive region, each of said negative contact pads contacting one of said wells of n-conductivity type located above said at least one positive conductive region;
forming on said conductive layer a second insulating layer;
patterning said second insulating layer to expose said contact pads;
forming a package comprising the steps of:
forming on a heat spreader device a layer of heat spreader insulating material;
forming on said layer of heat spreader insulating material a layer of bus bar metal;
patterning said bus bar metal to comprise a positive bus bar and a negative bus bar separated from each other;
forming on said bus bars a layer of solder wettable material; and
joining said semiconductive structure and said package with a layer of low temperature solder.

43. A process for making a point contact solar device as in claim 42 in which said semiconductive layer is of silicon and said heat spreader device is of molybdenum.

44. A process for making a point contact solar device as in claim 42 further comprising, following said step of patterning said second insulation layer, the steps of:
forming on the bottom surface of said second insulation layer and exposed contact pads a second solder wettable material; and
forming on the bottom surface of said second solder wettable material a layer of solder.

45. A process for making a point contact solar device as in claim 44 in which said solder wettable materials are nickel.

46. A process for making a point contact solar device as in claim 42 further comprising, following said step of patterning said second insulation layer, the steps of:
separating said semiconductive layer into a plurality of dice; and
forming on the top and side surfaces of said dice a passivation region, thereby also forming an antireflection coating on said top and sides.

47. A process for making a point contact solar cell comprising:
forming in and adjacent to the bottom surface of a semiconductive layer wells of p-conductivity type and n-conductivity type in an alternating pattern;
forming an insulating layer on the bottom surface of said semiconductive layer and patterning said insulating layer to provide openings exposing said wells;
forming a conductive layer on said insulating layer;
patterning said conductive layer to comprise a plurality of conductive regions, said plurality of conductive regions comprising:
at least one negative conductive region and at least one positive conductive region, said at least one positive conductive region being patterned so as to contact those wells only of p-conductivity type located above said at least one positive conductive region, and said at least one negative conductive region being patterned so as to contact those of said wells only of n-conductivity type located above said at least one negative conductive region; and
a plurality of positive contact pads surrounded by said negative conductive region, each of said positive contact pads contacting one of said wells of p-conductivity type located above said positive contact pad, and a plurality of negative contact pads surrounded by said positive conductive region, each of said negative contact pads contacting one of said wells of n-conductivity type located above said negative contact pad;
forming on said conductive layer a second insulating layer;
patterning said second insulating layer to expose said contact pads;
forming on said second insulating layer and said exposed contact pads a metallization layer; and
patterning said metallization layer to form isolated regions for separately contacting said positive contact pads and said negative contact pads.

48. A process for making a point contact solar cell as in claim 47 comprising the further steps after patterning said metallization layer to form isolated regions, of separating said solar cell from other dice in a wafer which includes said solar cell and applying a passivation layer to sides and top of said solar cell.

49. A process for making a point contact solar cell as in claim 47 in which said metallization layer formed on said second insulation layer and said exposed contact pads comprises a solder wettable layer adjacent said second insulation layer, and a solder layer adjacent said solder wettable layer.

50. A process for making a point contact solar device as in claim 49 in which said solder wettable layer is nickel and said solder layer is an alloy of tin, lead, and silver.

51. A solar cell comprising:
a semiconductive layer having a top surface, a bottom surface and sides;
wells of p-conductivity type and n-conductivity type formed in said semiconductive layer in an alternating pattern, said wells extending to said bottom surface of said semiconductive layer;
a first insulating layer formed on said bottom surface of said semiconductive layer and patterned to expose surfaces of said wells of p-conductivity type and n-conductivity type;
at least one conductive layer formed beneath said first insulating layer comprising at least one negative conductive region and at least one positive conductive region, said at least one negative conductive region contacting said wells of n-conductivity type and said positive conductive region contacting said wells of p-conductivity type;
a passivation layer applied to said top surface and said sides of said semiconductive layer;
wherein said at least one negative conductive region comprises a first perforated conductive layer located beneath one portion of said semiconductive layer and contacting wells of a first conductivity type located in said one portion of said semiconductive layer, and a plurality of first conductive contact pads located beneath the remaining portion of said semiconductive layer and contacting wells of said first conductivity type located in said remaining portion of said semiconductive layer; and
said at least one positive conductive region comprises a second perforated conductive layer located beneath said remaining portion of said semiconductive layer and contacting wells of a second conductivity type located in said remaining portion of said semiconductive layer, and a plurality of second conductive contact pads located beneath said one portion of said semiconductive layer and contacting wells of said second conductivity type located in said one portion of said semiconductive layer;
said conductive layers being electrically separated from each other and from said contact pads and said conductive layers including fingers interdigitated with each other, said fingers having tips.

52. A solar cell as in claim 51 further comprising:
a second insulating layer having a top surface and a bottom surface, said insulation layer being applied to said bottom surface of said one conductive layer and patterned to form vias exposing said first and second conductive contact pads and vias exposing said tips of said fingers.

53. A solar cell as in claim 52 further comprising a second conductive layer applied to said bottom surface of said second insulating layer.

54. A point contact solar device comprising:
a semiconductive layer in the bottom surface of which are formed wells of p-conductivity type and n-conductivity type in an alternating pattern, the bottom surface of said semiconductive layer being passivated except at locations of said wells;

a first conductive layer comprising a plurality of first conductive regions beneath and in contact with said bottom surface of said semiconductive layer, said first conductive regions comprising at least one first negative conductive region and at least one first positive conductive region, said first positive and negatve conductive regions being laterally spaced apart and having fingers which interdigitate with fingers of an adjacent first conductive region;

said at least one first positive conductive region being patterned so as to contact only those of said wells of p-conductivity type located above said first positive conductive region, and to include within it a plurality of negative contact pads in contact with those of said wells of n-conductivity type surrounded by said positive conductive region and said at least one first negative conductive region being patterned so as to contact only those of said wells of n-conductivity type located above said first negative conductive region and to include within it a plurality of positive contact pads in contact with those of said wells of p-conductivity type surrounded by said negative conductive region;

an insulating layer formed on the bottom surface of said conductive layer and patterned to expose said positive and negative contact pads and to expoe tips of said fingers; and a second conductive layer formed on the bottom surface of said insulating layer and patterned to form second positive conductive regions adjacent second negative conductive regions, said second positive conductive regions being in electrical contact with said wells of p conductivity type in said semiconductive layer not contacted by said first positive conductive regions;

each of said second positive conductive regions being in electrical contact with tips of said fingers of at least one first positive conductive region adjacent to that first negative conductive region which is above said each second positive conductive region, and each of said second negative conductive regions being in electrical contract with tips of said fingers of at least one first negative conductive region adjacent to that first positive region which is above said each second negative conductive region.

55. A point contact solar device as in claim 54 in which:

said semiconductive layer comprises a plurality of separate dice; and a passivation region is provided on the top and side surfaces of each of said dice, said passivation region also comprising an antireflection coating on said top and sides.

* * * * *

UNITED STATES PATENT AND TRADEMARK OFFICE
CERTIFICATE OF CORRECTION

PATENT NO. : 4,836,861

DATED : June 6, 1989

INVENTOR(S) : Douglas L. Peltzer, Richard L. Bechtel, Wen C. Ko and William T. Liggett It is certified that error appears in the above-identified patent and that said Letters Patent is hereby corrected as shown below:

Col. 2, line 24, change "well  The" to --well.  The--.

Col. 2, line 26, change "3ln2alternates" to --3ln2 alternates--.

Col. 4, line 23, change "shownin" to --shown in--.

Col. 4, line 28, change "24 g" to --24g--.

Col. 5, line 53, change "cnductivity" to --conductivity--.

Col. 10, line 18, change "inlcudes" to --includes--.

Col. 12, line 38, change "ir" to --in--.

Col. 12, line 60, change "buss" to --bus--.

Col. 13, line 39, change "therfore" to --therefore--

Col. 13, line 45, change "move" to --more--.

Col. 14, line 9, change "crennellated" to --crenellated--.

UNITED STATES PATENT AND TRADEMARK OFFICE
CERTIFICATE OF CORRECTION

PATENT NO. : 4,836,861

DATED : June 6, 1989

INVENTOR(S) : Douglas L. Peltzer et al

It is certified that error appears in the above-identified patent and that said Letters Patent is hereby corrected as shown below:

Col. 14, line 13, change "hown" to --shown--.

Signed and Sealed this

Twenty-fourth Day of April, 1990

Attest:

HARRY F. MANBECK, JR.

*Attesting Officer*  *Commissioner of Patents and Trademarks*